(12) United States Patent
Toner et al.

(10) Patent No.: US 11,646,371 B2
(45) Date of Patent: *May 9, 2023

(54) MOSFET TRANSISTORS WITH HYBRID CONTACT

(71) Applicants: Amplexia, LLC, Durham, NC (US); X-FAB Global Services GmbH, Erfurt (DE)

(72) Inventors: Brendan Toner, Sarawak (MY); Zhengchao Liu, Kuching (MY); Gary M Dolny, Mountain Top, PA (US); William R Richards, Jr., Cary, NC (US)

(73) Assignees: Amplexia, LLC, Durham, NC (US); X-FAB Global Services GmbH, Erfurt (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/729,777

(22) Filed: Apr. 26, 2022

(65) Prior Publication Data

US 2022/0254914 A1 Aug. 11, 2022

Related U.S. Application Data

(63) Continuation of application No. 17/096,264, filed on Nov. 12, 2020, now Pat. No. 11,322,611, which is a
(Continued)

(51) Int. Cl.
*H01L 29/78* (2006.01)
*H01L 29/10* (2006.01)
(Continued)

(52) U.S. Cl.
CPC ........ *H01L 29/782* (2013.01); *H01L 29/1095* (2013.01); *H01L 29/45* (2013.01);
(Continued)

(58) Field of Classification Search
CPC ........ H01L 29/7839; H01L 29/66681–66704; H01L 29/7816–7826; H01L 29/782;
(Continued)

(56) References Cited

U.S. PATENT DOCUMENTS 3,906,540 A 9/1975 Hollins
4,362,597 A 12/1982 Fraser et al.
(Continued)

FOREIGN PATENT DOCUMENTS

JP H02 119184 A 5/1990
WO 2017192432 A1 11/2017
(Continued)

OTHER PUBLICATIONS

Information Disclosure Statement (IDS) Letter Regarding Common Patent Application(s), dated May 4, 2022.
(Continued)

*Primary Examiner* — Eric A. Ward
(74) *Attorney, Agent, or Firm* — Tillman, Wright & Wolgin; James D. Wright; Neal B. Wolgin

(57) ABSTRACT

A lateral DMOS transistor structure includes a substrate of a first dopant polarity, a body region of the first dopant polarity, a source region, a drift region of a second dopant polarity, a drain region, a channel region, a gate structure over the channel region, a hybrid contact implant, of the second dopant polarity, in the source region, and a respective metal contact on or within each of the source region, gate structure, and drain region. The hybrid contact implant and the metal contact together form a hybrid contact defining first, second, and third electrical junctions. The first junction is a Schottky junction formed vertically between the source metal contact and the body. The second junction is an ohmic junction formed laterally between the source metal contact and the hybrid contact implant. The third junction is a
(Continued)

rectifying PN junction between the hybrid contact implant and the channel region.

23 Claims, 23 Drawing Sheets
(1 of 23 Drawing Sheet(s) Filed in Color)

Related U.S. Application Data continuation of application No. 16/845,666, filed on Apr. 10, 2020, now Pat. No. 10,892,362.

(60) Provisional application No. 62/931,535, filed on Nov. 6, 2019.

(51) Int. Cl.
| | | |
|---|---|---|
| *H01L 29/45* | (2006.01) | |
| *H01L 29/49* | (2006.01) | |
| *H01L 29/66* | (2006.01) | |
| *H01L 21/265* | (2006.01) | |
| *H01L 21/266* | (2006.01) | |
| *H01L 21/28* | (2006.01) | |
| *H01L 21/285* | (2006.01) | |
| *H01L 21/225* | (2006.01) | |

(52) U.S. Cl.
CPC .... *H01L 29/4933* (2013.01); *H01L 29/66643* (2013.01); *H01L 29/66681* (2013.01); *H01L 29/66689* (2013.01); *H01L 29/7839* (2013.01); H01L 21/2253 (2013.01); H01L 21/266 (2013.01); H01L 21/26513 (2013.01); H01L 21/28052 (2013.01); H01L 21/28518 (2013.01)

(58) Field of Classification Search
CPC ......... H01L 29/66689; H01L 29/66643; H01L 29/4933; H01L 21/2253; H01L 21/26513; H01L 21/266; H01L 21/28052; H01L 21/28518; H01L 21/1095; H01L 29/45–458; H01L 29/47; H01L 29/475
See application file for complete search history.

(56) References Cited

U.S. PATENT DOCUMENTS

| | | | |
|---|---|---|---|
| 4,692,348 A | 9/1987 | Rubloff et al. | |
| 4,983,535 A | 1/1991 | Blanchard | |
| 5,567,969 A | 10/1996 | Hall | |
| 5,585,294 A | 12/1996 | Smayling et al. | |
| 5,629,544 A | 5/1997 | Voldman et al. | |
| 5,663,584 A | 9/1997 | Welch | |
| 5,808,340 A | 9/1998 | Wollesen et al. | |
| 5,811,857 A | 9/1998 | Assaderaghi et al. | |
| 5,960,271 A | 9/1999 | Wollesen et al. | |
| 6,015,993 A | 1/2000 | Voldman et al. | |
| 6,232,163 B1 | 5/2001 | Voldman et al. | |
| 6,252,278 B1 | 6/2001 | Hsing | |
| 6,303,479 B1 | 10/2001 | Snyder | |
| 6,339,005 B1 | 1/2002 | Bryant et al. | |
| 6,495,882 B2 | 12/2002 | Snyder | |
| 6,686,233 B2 | 2/2004 | Söderbärg et al. | |
| 6,744,103 B2 | 6/2004 | Snyder | |
| 6,777,745 B2 | 8/2004 | Hshieh et al. | |
| 6,876,035 B2 | 4/2005 | Abadeer et al. | |
| 6,900,101 B2 | 5/2005 | Lin | |
| 6,958,515 B2 | 10/2005 | Hower et al. | |
| 7,052,941 B2 | 5/2006 | Lee | |
| 7,081,655 B2 | 7/2006 | Maszara | |
| 7,173,310 B2 | 2/2007 | Voldman et al. | |
| 7,176,537 B2 | 2/2007 | Lee et al. | |
| 7,221,019 B2 | 5/2007 | Snyder et al. | |
| 7,306,998 B2 | 12/2007 | Maszara | |
| 7,432,579 B2 | 10/2008 | Matsudai et al. | |
| 7,544,557 B2 | 6/2009 | Levin et al. | |
| 7,575,977 B2 | 8/2009 | Levin et al. | |
| 7,576,388 B1 | 8/2009 | Wilson et al. | |
| 7,745,846 B2 | 6/2010 | Korec et al. | |
| 7,851,889 B2 | 12/2010 | Zhu et al. | |
| 7,960,997 B2 | 6/2011 | Williams | |
| 8,058,167 B2 | 11/2011 | Snyder et al. | |
| 8,154,025 B2 | 4/2012 | Snyder et al. | |
| 8,508,015 B2 | 8/2013 | Allen et al. | |
| 8,889,537 B2 | 11/2014 | Cabral, Jr. et al. | |
| 9,337,329 B2 | 5/2016 | Hu et al. | |
| 9,425,304 B2 | 8/2016 | Zhang et al. | |
| 9,947,787 B2 | 4/2018 | Dolny et al. | |
| 10,090,409 B2 | 10/2018 | McGregor et al. | |
| 10,510,869 B2 | 12/2019 | Dolny et al. | |
| 10,892,362 B1* | 1/2021 | Toner | H01L 29/66659 |
| 11,322,611 B2 | 5/2022 | Toner et al. | |
| 2004/0119103 A1 | 6/2004 | Thapar | |
| 2005/0035410 A1 | 2/2005 | Yeo et al. | |
| 2005/0098845 A1 | 3/2005 | Matsudai et al. | |
| 2007/0001223 A1 | 1/2007 | Boyd et al. | |
| 2008/0164537 A1 | 7/2008 | Cai | |
| 2009/0102007 A1 | 4/2009 | Kocon | |
| 2010/0059819 A1 | 3/2010 | Snyder | |
| 2010/0230751 A1 | 9/2010 | Botula et al. | |
| 2011/0049624 A1 | 3/2011 | Guo et al. | |
| 2011/0057230 A1 | 3/2011 | Udrea et al. | |
| 2012/0080728 A1 | 4/2012 | Malhan | |
| 2012/0139047 A1 | 6/2012 | Luo et al. | |
| 2012/0181586 A1 | 7/2012 | Luo et al. | |
| 2012/0193747 A1 | 8/2012 | Rassel et al. | |
| 2012/0211859 A1 | 8/2012 | Stribley et al. | |
| 2012/0220091 A1 | 8/2012 | Challa et al. | |
| 2013/0140625 A1 | 6/2013 | Piao et al. | |
| 2013/0277791 A1 | 10/2013 | Nassar et al. | |
| 2014/0357038 A1 | 12/2014 | Shekar | |
| 2015/0001620 A1 | 1/2015 | McGregor et al. | |
| 2015/0001666 A1 | 1/2015 | Chiang | |
| 2015/0084118 A1 | 3/2015 | Van Brunt et al. | |
| 2015/0187928 A1 | 7/2015 | Wang et al. | |
| 2015/0243501 A1 | 8/2015 | Thomason et al. | |
| 2016/0260831 A1 | 9/2016 | Prasad et al. | |
| 2017/0323970 A1 | 11/2017 | Dolny et al. | |
| 2017/0373180 A1 | 12/2017 | Haeberlen et al. | |
| 2018/0212041 A1 | 7/2018 | Dolny et al. | |
| 2018/0358352 A1 | 12/2018 | Voldman et al. | |
| 2019/0237457 A1 | 8/2019 | Yamada et al. | |
| 2020/0220005 A1 | 7/2020 | Huang | |
| 2021/0134999 A1 | 5/2021 | Toner et al. | |

FOREIGN PATENT DOCUMENTS

| | | |
|---|---|---|
| WO | 2018227086 A1 | 12/2018 |
| WO | 2021092117 A1 | 5/2021 |

OTHER PUBLICATIONS

Chen, Chi-Kuang, Huang, Chien-Fu, Chang, Yi-Feng, Lee, Jam-Wem, Cheng, Shui-Ming, Song, Ming-Hsiang, Schottky Emmitter High Holding Voltage ESD Clamp in BCD Power Technology, Aug. 2012, (6 pages).

Jain, A. & Parthavi, U.M.; "Schottky Laterally Double Diffused Metal Oxide Semiconductor", Department of Electrical Engineering, Indian Institute of Technology, Delhi, Hauz Khas, New Delhi—110016, India, May 2010.

Atsuhiro Kinoshita, "Dopant Segregated Schottky S/D and Application to High Performance MOSFETs", Ext. Abs. the th International Workshop on Junction Technology, 2009, pp. 34-37.

Atsuhiro Kinoshita, "Dopant-Segregated Source/Drain Technology for High-Performance CMOS", IEDM 2008.

T. Kinoshita, R. Hasumi, M. Hamaguchi, K. Miyashita, T. Komoda, A. Kinoshita, J. Koga, K. Adachi, Y. Toyoshima, T. Nakayama, S. Yamada and F. Matsuoka, "Ultra-Low Voltage Operations in Bulk CMOS Logic Circuits with Dopant Segregated Schottky Source/Drain Transistors", IEDM 2006.

A. Kinoshita, C. Tanaka, K. Uchida and J. Koga, "High-performance 50-nm-Gate-Length Schottky-Source/Drain MOSFETs

(56) References Cited

OTHER PUBLICATIONS with Dopant-Segregation Junctions", Symposium on VLSI Technology Digest of Technical Papers, 2005, pp. 158-159.

A. Kinoshita, Y. Tsuchiya, A. Yagishita, K. Uchida and J. Koga, "Solution for High-Performance Schottky-Source/Drain MOSFETs: Schottky Barrier Height Engineering with Dopant Segregation Technique", Symposium on VLSI Technology Digest of Technical Papers, pp. 168-169, 2004.

Lee et al. "Schottky LDNMOS for HV ESD Protection". Globalfoundries Inc., (10 pages).

Lin, Chun-Yu, "Diode String With Reduced Clamping Voltage for Efficient On-Chip ESD Protection". IEEE Transaction on Device and Materials Reliability, vol. 16, No. Dec. 4, 2016, pp. 688-690, (3 pages).

Nishi, Yoshifumi, et al., "Schottky barrier height modulation by atomic dipoles at the silicide/silicon interface", Physical Review B 84, 115323 (2011), published Sep. 26, 2011, (6 pages).

Nishisaki et al. "Schottky SOI MOSFET with Shallow Doped-Extension" The Japan Society of Applied Physics, Japanese Journal of Applied Physics, vol. 42, Part 1 Number 4B, (2009).

Zhang et al., "Probing the Interface Barriers of Dopant-Segregated Silicide-Si Diodes With Internal Photoemission" IEEE Transactions of Electron Devices, vol. 59, No. 8, Aug. 2012, pp. 2027-2032, (6 pages).

U.S. Appl. No. 62/333,073, Dolny et al., filed May 6, 2016, Drawings, Specification, Claims, Abstract.

Toner et al. "Schottky Source LDMOS—Electrical SOA Improvement through BJT Suppression", (4 pages).

"International Search Report" and "Written Opinion of the International Searching Authority" (ISA/EPO) in SILICET, LLC, International Patent Application Serial No. PCT/US2020/059027, dated Feb. 17, 2021 (16 pages).

\* cited by examiner

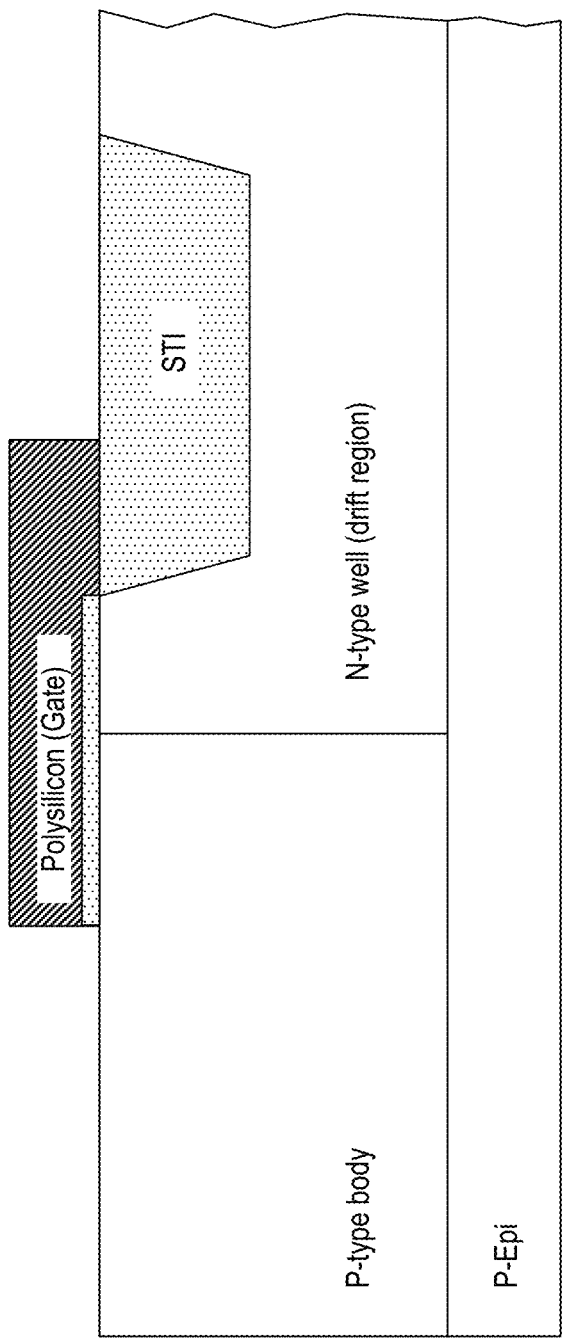
FIG. 12A   Poly deposition and poly etch to form the transistor gate

Shallow Arsenic implantation. The gate poly enables self-alignment of the implant.

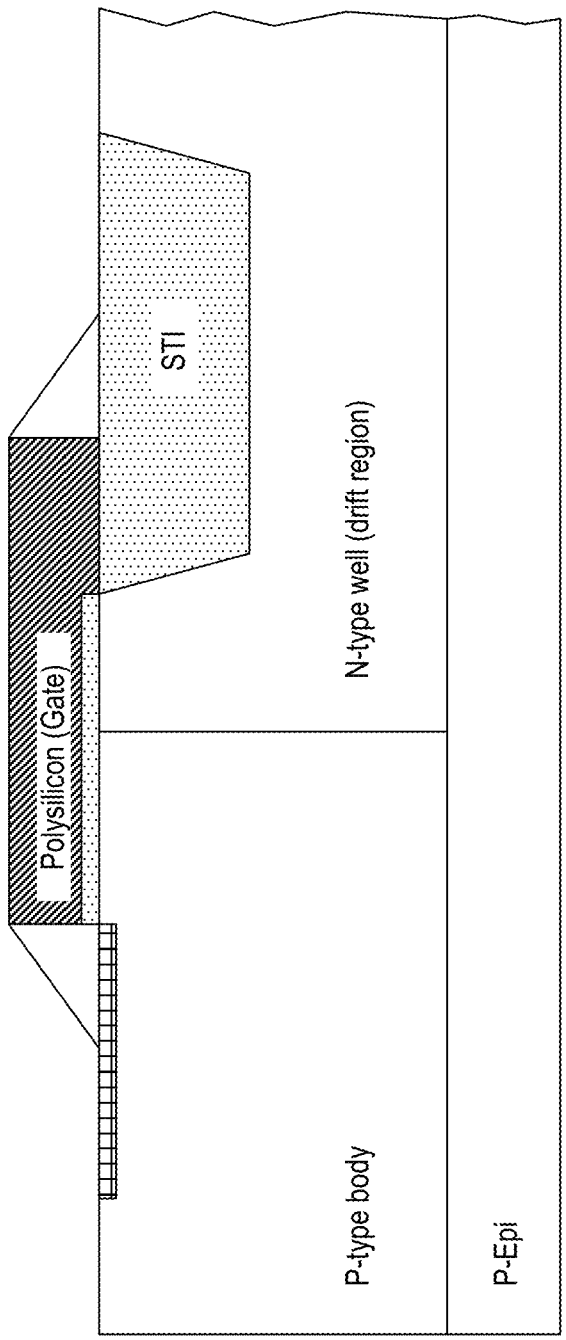
FIG. 12C    Gate sidewall spacer structures formation

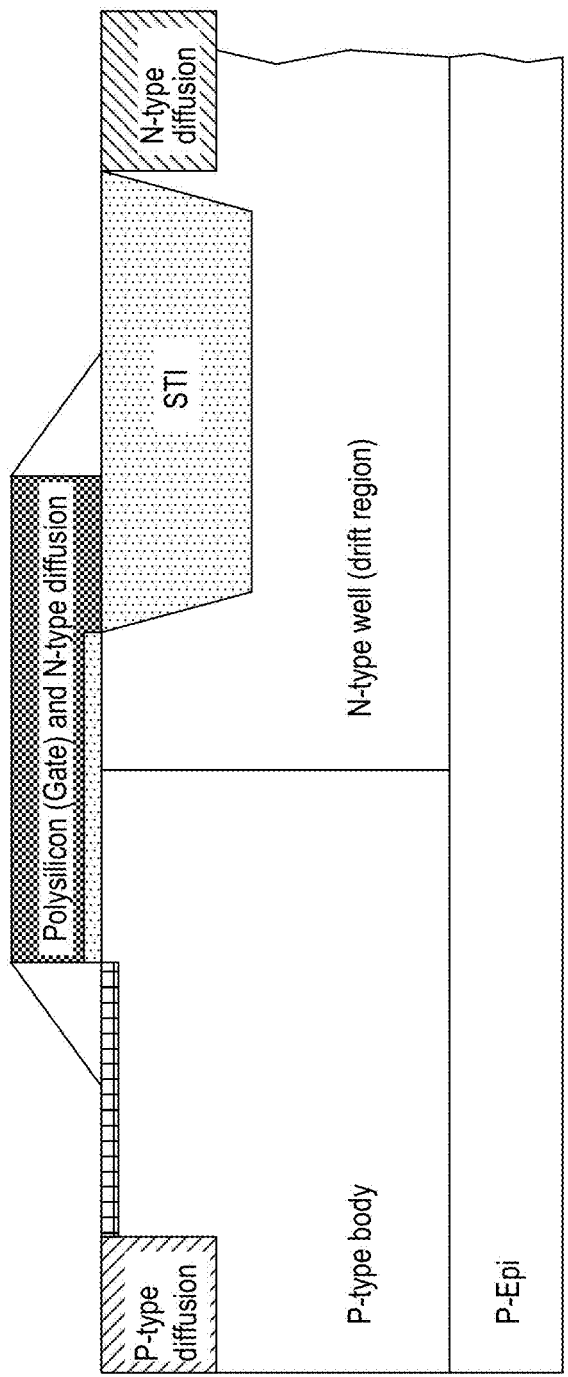
FIG. 12D  N-type and P-type diffusions to form the drain and body tap Silicidation to form the hybrid contact and ohmic contacts to the body tap, gate structure, and drain region.

3000

3100
DEPOSIT AND ETCH POLYSILICON TO FORM GATE STRUCTURE

3200
IMPLANT SHALLOW, DOPED MATERIAL IN BODY REGION ALIGNED WITH GATE

3300
FORM GATE SIDEWALL/SPACER STRUCTURE

3400
DIFFUSE P-TYPE DOPANT INTO BODY REGION TO FORM BODY TAP

3500
APPLY PHOTORESIST COATING TO BODY REGION/TAP, BUT EXPOSE GATE STRUCTURE AND DRIFT REGION

3600
DIFFUSE DOPANT TO FORM DEGENERATIVE GATE AND DRAIN REGION

3700
DEPOSIT BLANKET LAYER OF METAL

3800
SILICIDIZE

*FIG. 13*

MOSFET TRANSISTORS WITH HYBRID CONTACT

CROSS-REFERENCE TO RELATED APPLICATION

The present application is a continuation of and claims priority under 35 U.S.C. § 120 to U.S. patent application Ser. No. 17/096,264, filed Nov. 12, 2020 (the "'264 application"), which '264 application published as U.S. Patent application publication no. US 2021/0134999 A1 on May 6, 2021 and issues as U.S. Pat. No. 11,322,611 on May 3, 2022, which '264 application, the application publication thereof, and the patent issuing therefrom are each incorporated herein by reference in their entirety, and which '264 application is a U.S. continuation patent application of, and claims priority under 35 U.S.C. § 120 to, U.S. patent application Ser. No. 16/845,666, filed Apr. 10, 2020 (the "'666 application"), which '666 application issued as U.S. Pat. No. 10,892,362 on Jan. 12, 2021, which '666 application and the patent issuing therefrom are each incorporated herein by reference in their entirety, and which '666 application is a U.S. nonprovisional patent application of, and claims priority under 35 U.S.C. § 119(e) to, U.S. provisional patent application Ser. No. 62/931,535, filed Nov. 6, 2019 (the "'535 application), which '535 provisional patent application is incorporated herein by reference in its entirety.

COPYRIGHT STATEMENT

All of the material in this patent document is subject to copyright protection under the copyright laws of the United States and of other countries. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE PRESENT INVENTION

Field of the Present Invention

The disclosure relates generally to structures and corresponding design methods of metal oxide semiconductor field effect transistors (MOSFETs), more particularly, to the formation of a hybrid contact, containing Schottky, ohmic, and rectifying PN junctions, during fabrication of the source region in LDMOS and the source and/or drain in other MOSFETs.

Background

Semiconductor reliability and robustness have been a primary industry focus for decades. One such factor of reliability and robustness is related to Electrical Safe Operating Area (E-SOA). Although E-SOA may be affected by various factors, one phenomenon that can significantly affect E-SOA is bipolar-induced snapback associated with parasitic bipolar junction transistors (BJTs) in MOSFETS. For purposes of illustration, FIG. 1A is a cross-sectional view of an exemplary LDMOS device 10 showing a parasitic BJT 40. The LDMOS device 10 has a p-type substrate 21, a p-type body 20, an n-type well 13, a body tap 18 (made of p-type diffusion), shallow trench isolation 11, a gate structure 16 (polysilicon on gate oxide) and gate sidewall spacer structure 15, a source region 14 (made of n-type diffusion), a drain region 12 (made of n-type diffusion), and ohmic contacts 22,23,24 at the source with abutted body tap, gate and drain, respectively, created by silicide placement. Conventional "ohmic contacts" have an ohmic connection between the silicide and the n+ diffusion and a rectifying PN junction between the n+ diffusion and the underlying body/well. The device 10 in FIG. 1A includes an inherent parasitic bipolar junction transistor (BJT) 40 formed between the source 14, body 20, and n-type well (drift region) 13 of the device 10. These three areas form the bipolar emitter (source 14), base (body 20), and collector (drift region 13), respectively, of the parasitic BJT 40. When high voltages are applied to the drain 12, the parasitic BJT 40 can activate at the trigger voltage ($V_{t1}$), which causes an alternative current path ($I_{h1}$) 42 between the drain 12 and source 14 of the device 10. As the gate voltage increases, the drain voltage at which the BJT triggers becomes even lower, reducing the E-SOA of the LDMOS device 10. When the parasitic BJT 40 dominates the device 10 operation, the localized current causes very high temperatures and ultimately results in the destruction of the device. This is represented generally in FIG. 1B, which is a graphical illustration of the stages of bipolar triggering and device destruction.

The traditional approach to mitigating the parasitic BJT of the LDMOS device has been to use a highly doped buried body (well) region directly beneath the n-type diffusion 14. The effect of this is to reduce the body resistance (Rbulk) 49. With lower Rbulk 49, less base-emitter voltage can be developed across this resistance in response to hole current from the drain-bulk junction breakdown. With lower base-emitter voltage, the triggering of the bipolar is suppressed.

Parasitic BJT problems also exist in complimentary MOS (CMOS) devices. In this regard, FIG. 1C is a cross-sectional view of an exemplary n-channel and p-channel CMOS device showing parasitic BJTs 70,80 which combine to form a parasitic silicon controlled rectifier (SCR) structure. More specifically, FIG. 1C shows complementary NMOS and PMOS devices including a p-type substrate 321, a p-type well 31, a n-type well 51, a p-type well body tap 18 (made of a p-type diffusion), an n-type well body tap 58 (made of an n-type diffusion), an NMOS gate structure (n-type polysilicon on gate oxide) 16, a PMOS gate structure (p-type polysilicon on gate oxide) 56, gate sidewall spacer structure 15, an NMOS source region 14 (made of an n-type diffusion), an NMOS drain region 12 (made of an n-type diffusion), a PMOS source region 54 (made of a p-type diffusion) a PMOS drain region 55 (made of a p-type diffusion), and ohmic contacts 22,23,24,25 at the source, gate, drain and body tap regions, respectively, created by silicide placement. Activation of the parasitic SCR induces latchup, the inadvertent creation of a low-impedance path by electrostatic discharge (ESD), electrical overstress (EOS) or ionizing radiation events, triggering the parasitic SCR and causing continuous current flow in the SCR structure, which can lead to permanent destruction of the CMOS device.

An alternative approach has also been utilized, wherein instead of focusing on the body/well under the source-diffusion, the design of the source, which forms the emitter of the parasitic bipolar, is modified by utilizing a Schottky junction. Replacing the PN source with a Schottky source helps the E-SOA in two ways. First, a shallower source gives holes from the drain-bulk breakdown a more direct path to the body tap. Therefore, the resistance seen by these holes is lower than a deeper diffusion source, and a lower effective Rbulk 49,79,89 is thus obtained. Second, Schottky junctions have a barrier to electron injection, whereas PN junctions do not. This means that when the Schottky junction is forward biased, the electron injection is greatly reduced from the emitter into the base region, and thus the bipolar cannot trigger. The combination of both factors enables the parasitic bipolar to be suppressed and the electrical SOA to be extended compared to a conventional LDMOS device. For the CMOS device, reducing the bipolar gains of the parasitic SCR eliminates latchup.

Various solutions involving Schottky junctions or contacts, defined as metal (or metal with interfacial dopant) to well/bulk source and/or drain junctions, have been explored in some MOSFET devices in order to solve a variety of problems including extending the E-SOA. However, as detailed further below, each falls short in providing a complete solution across MOS devices.

For example, U.S. Pat. No. 9,947,787 to Dolny et al. ("Dolny") discloses a power MOSFET (LDMOS) with what it refers to as a "Schottky" or "Schottky-like" source. For these devices, Dolny teaches replacing the highly doped source/drain regions with a Schottky or Schottky-like contact. These Schottky contacts create Schottky barriers between the source and/or drain region and the body or well of the device. Due to the nature of an LDMOS design, spacers are used between the gate and source/drain regions. Notably, Dolny also teaches "after the (gate) spacer formation . . . after the p+ body contact implant and anneal, the Schottky or Schottky-like contact is formed" which guarantees that even when dopant segregation is used to modify the barrier height of the Schottky junction, a significant barrier height is maintained between the silicide and silicon. This limits the electron conduction between the source and channel regions, thereby reducing the drive current and increasing the on-resistance of the transistor.

A series of Short-channel Schottky-barrier MOSFET device and manufacturing patents by inventor John P. Snyder also describe MOSFET devices which utilize Schottky barrier contacts for source and/or drain contact fabrication within the context of a MOSFET device structure to eliminate the requirement for halo/pocket implants and shallow source/drain extensions to control short channel effects. These patents include U.S. Pat. Nos. 8,058,167, 8,154,025, 7,221,019, 6,744,103, 6,495,882, and 6,303,479.

In one example, U.S. Pat. No. 6,495,882 to Snyder ("Snyder") defines a short-channel MOSFET device with a Schottky or Schottky-like source and/or drain area for devices with less than 100 nm channel lengths. For these devices, Snyder teaches replacing the highly doped source/drain regions 14,12,54,55, the lightly doped source/drain extensions 33,53 (often referred to as "LDD" areas), and the pocket/halo implants 32,52 with metal silicide such as platinum silicide, palladium silicide, and iridium silicide. These Schottky contacts create Schottky barriers between the source region and the well or body of the device. Benefits from this method of MOSFET design include reduction in manufacturing complexity, due to avoiding the need for LDD implants 33,53 and thus pocket/halo implants 32,52, reduction in capacitance with the absence of the pocket/halo implants 32,52, and elimination of the parasitic bipolar gain and associated latchup. The Snyder design, however, is limited by the channel length as well as the channel dopant concentrations.

In both Dolny and Snyder no dopant is located under the spacer. As noted above, a significant barrier height is maintained between the silicide and silicon, limiting the electron conduction between the source and/or drain and channel region, reducing the drive current and increasing the on-resistance of the transistor.

M. Nishisaka contemplates a "Schottky SOI MOSFET with Shallow Doped-Extension." Because Nishisaka's device is an SOI MOSFET, the current leakage described above is not an issue. The metal-semiconductor Schottky junction only exists laterally between a deep (200 nm) silicide, placed on the SOI, and the adjacent body region. Vertically, Nishisaka's source/drain silicide has an oxide termination in contrast to that demonstrated by Snyder and Dolny.

Currently, the Schottky contacts in Snyder and Dolny eliminate the parasitic BJT 40,70,80 in those MOSFET devices, thus allowing for a greater drain voltage. However, in all designs with vertical Schottky junctions between silicide metal and bulk, dopant/implants do not exist under the spacer region for the purposes of providing a low ohmic path to the channel. For a square E-SOA, an ideal Schottky source junction, with minimal dopant, is desired to minimize electron injection and suppress BJT triggering under an ESD event. Thus, a need exists for the ability to minimize the triggering of parasitic BJTs in MOSFET devices, thereby improving the E-SOA as well as maintain high MOSFET channel currents while maintaining low junction leakage using a simple cost-effective manufacturing process.

SUMMARY OF THE PRESENT INVENTION

Some exemplary embodiments of the present invention may overcome one or more of the above disadvantages and other disadvantages not described above, but the present invention is not required to overcome any particular disadvantage described above, and some exemplary embodiments of the present invention may not overcome any of the disadvantages described above.

The present invention includes many aspects and features. Moreover, while many aspects and features relate to, and are described in, the context of LDMOS devices, the present invention is not limited to use only in LDMOS devices, as will become apparent from the following summaries and detailed descriptions of aspects, features, and one or more embodiments of the present invention.

Broadly defined, an aspect of one or more embodiments of the present invention relates to a lateral DMOS transistor structure, including: a substrate of a first dopant polarity; a body region of a first dopant polarity; a source region on or within the body region; a drift region of a second dopant polarity; a drain region on or within the drift region; a channel region between the source region and the drift region; a gate structure over the channel region; a hybrid contact implant, of the second dopant polarity, in the source region; and a respective metal contact on or within each of the source region, the gate structure, and the drain region; wherein the hybrid contact implant and the metal contact that is on or within the source region combine to form a hybrid contact that defines first, second, and third electrical junctions, wherein the first electrical junction is a Schottky junction formed vertically between the source metal contact and the body, wherein the second electrical junction is an ohmic junction formed laterally between the source metal contact and the hybrid contact implant, and wherein the third electrical junction is a rectifying PN junction between the hybrid contact implant and the channel region.

In a feature of this aspect, the hybrid contact implant is aligned to the gate structure.

In another feature of this aspect, the hybrid contact implant has an as-implanted depth that defines a first depth, the metal contact of the hybrid contact has a second depth, and the first depth is less than that of the second depth.

In another feature of this aspect, the hybrid contact implant has a doping concentration that is greater than 1e19 atoms per cubic centimeter.

In another feature of this aspect, an interfacial dopant layer is provided between the metal contact and the body region thereby modulating a barrier height and turn-on voltage of the first electrical junction.

In another feature of this aspect, the first electrical junction has a turn-on voltage that is in the range 0.1V to 0.5V.

In another feature of this aspect, a parasitic bipolar junction transistor is formed from the drain-body-source regions, and wherein the parasitic bipolar junction transistor formed from the drain-body-source regions has a bipolar gain of less than 1.

In another feature of this aspect, the gate structure has a source region side and a drain region side, wherein a gate sidewall spacer structure is disposed along the gate structure on the source region side thereof, and wherein the hybrid contact implant is disposed directly beneath the gate sidewall spacer structure. In further features, the metal contact that is on or within the source region is aligned to the gate sidewall spacer structure; and/or a first portion of the hybrid contact implant is disposed beneath the gate sidewall spacer structure and a second portion of the hybrid contact implant is exposed adjacent to the gate sidewall spacer structure, the second electrical junction is formed laterally between the source metal contact and the first portion of the hybrid contact implant, and the third electrical junction is a rectifying PN junction between the first portion of the hybrid contact implant and the channel region.

In another feature of this aspect, each of the respective metal contacts on or within each of the source region, gate structure, and drain region is a silicide.

Broadly defined, another aspect of one or more embodiments of the present invention relates to a method of fabricating a power transistor structure, including the steps of: providing a substrate of a first dopant polarity, wherein the substrate includes a body region that is also of the first dopant polarity; forming a drift region, of a second dopant polarity, on or within the substrate; forming a gate structure by oxide growth, polysilicon deposition and polysilicon etch over a portion of the body region and a portion of the drift region; implanting a dopant of the second dopant polarity into the body region which is aligned to the gate structure, the implanted dopant defining a hybrid contact implant that has a first depth; forming a gate sidewall spacer structure such that a first portion of the hybrid contact implant is disposed beneath the gate sidewall spacer structure and a second portion of the hybrid contact implant is exposed adjacent to the gate sidewall spacer structure; diffusing a dopant of the first dopant polarity into the body region to form a body tap; applying a photoresist coating to the body region, including the body tap, adjacent to the gate structure, but leaving the gate structure and drift region exposed; diffusing a dopant of the second dopant polarity into the gate structure and into the drift region to form a drain region; depositing a blanket layer of metal; annealing the metal of the blanket layer to react with exposed silicon/polysilicon on the body tap, the drain region, the gate structure and the second portion of the hybrid contact implant to form a silicide, wherein the silicide formed on the second portion of the hybrid contact implant has a second depth, and wherein the second depth is greater than the first depth; and removing unreacted portions of the blanket layer of metal, thereby resulting in metal contacts to the body tap, the drain region, the gate structure, and the hybrid contact implant; whereby the silicide, the first portion of the hybrid contact implant, and the second portion of the hybrid contact implant together form a hybrid contact, which constitutes a source region, and wherein a channel region is established between the source region and the drift region; and whereby the resulting hybrid contact defines first, second, and third electrical junctions, wherein the first electrical junction is a Schottky junction formed vertically between the silicide and the substrate, wherein the second electrical junction is an ohmic junction formed laterally between the silicide and the first portion of the hybrid contact implant, and wherein the third electrical junction is a rectifying PN junction between the first portion of the hybrid contact implant and the channel region.

In another feature of this aspect, the method further comprises a step, prior to the implanting step, of applying a first photoresist coating to the drift region and a portion of the body region, and wherein the implanting step is carried out using the first photoresist coating and a portion of the gate structure as a mask.

In another feature of this aspect, the source region does not include a diffusion of a dopant of the second dopant polarity in the body region.

In another feature of this aspect, depositing metal on the second, exposed, portion of the hybrid contact implant and annealing the metal deposited thereon causes the formation of an interfacial dopant layer between the silicide and the body region.

Broadly defined, another aspect of one or more embodiments of the present invention relates to a method of fabricating a power transistor structure, including the steps of: a substrate of a first dopant polarity, wherein the substrate includes a body region that is also of the first dopant polarity; forming a drift region, of a second dopant polarity, on or within the substrate; forming a gate structure by oxide growth, polysilicon deposition and polysilicon etch over a portion of the body region and a portion of the drift region; applying a first photoresist coating to the drift region and a portion of the body region; using the first photoresist coating and a portion of the gate structure as a mask, implanting a dopant of the second dopant polarity into the body region, the implanted dopant defining a hybrid contact implant that has a first depth; forming a gate sidewall spacer structure such that a first portion of the hybrid contact implant is disposed beneath the gate sidewall spacer structure and a second portion of the hybrid contact implant is exposed adjacent to the gate sidewall spacer structure; diffusing a dopant of the first dopant polarity into the body region to form a body tap; applying a second photoresist coating to the body region, including the body tap, adjacent to the gate structure, but leaving the gate structure and drift region exposed; diffusing a dopant of the second dopant polarity into the gate structure and into the drift region to form a drain region; depositing a blanket layer of metal; annealing the metal of the blanket layer to react with exposed silicon/polysilicon on the body tap, the drain region, the gate structure and the second portion of the hybrid contact implant to form a silicide, wherein the silicide formed on the second portion of the hybrid contact implant has a second depth, and wherein the second depth is greater than the first depth; and removing unreacted portions of the blanket layer of metal, thereby resulting in metal contacts to the body tap, the drain region, the gate structure, and the hybrid contact implant; whereby the silicide, the first portion of the hybrid contact implant, and the second portion of the hybrid contact implant together form a hybrid contact, which constitutes a source region, and wherein a channel region is established between the source region and the drift region; and whereby the resulting hybrid contact defines first, second, and third electrical junctions, wherein the first electrical junction is a Schottky junction formed vertically between the silicide and the substrate, wherein the second electrical junction is an ohmic junction formed laterally between the silicide and the first portion of the hybrid contact implant, and wherein the third electrical junction is a rectifying PN junction between the first portion of the hybrid contact implant and the channel region.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Further features, embodiments, and advantages of the present invention will become apparent from the following detailed description with reference to the drawings, wherein:

FIGS. 12A-12E are cross-sectional views illustrating various steps in a method of fabricating a hybrid contact LDMOS device in one or more preferred embodiments of the invention; and FIG. 13 is a flowchart illustrating steps of the hybrid contact LDMOS device fabrication process of FIGS. 12A-12E.

DETAILED DESCRIPTION OF THE PREFERRED EMBODIMENTS

Figure 1A:
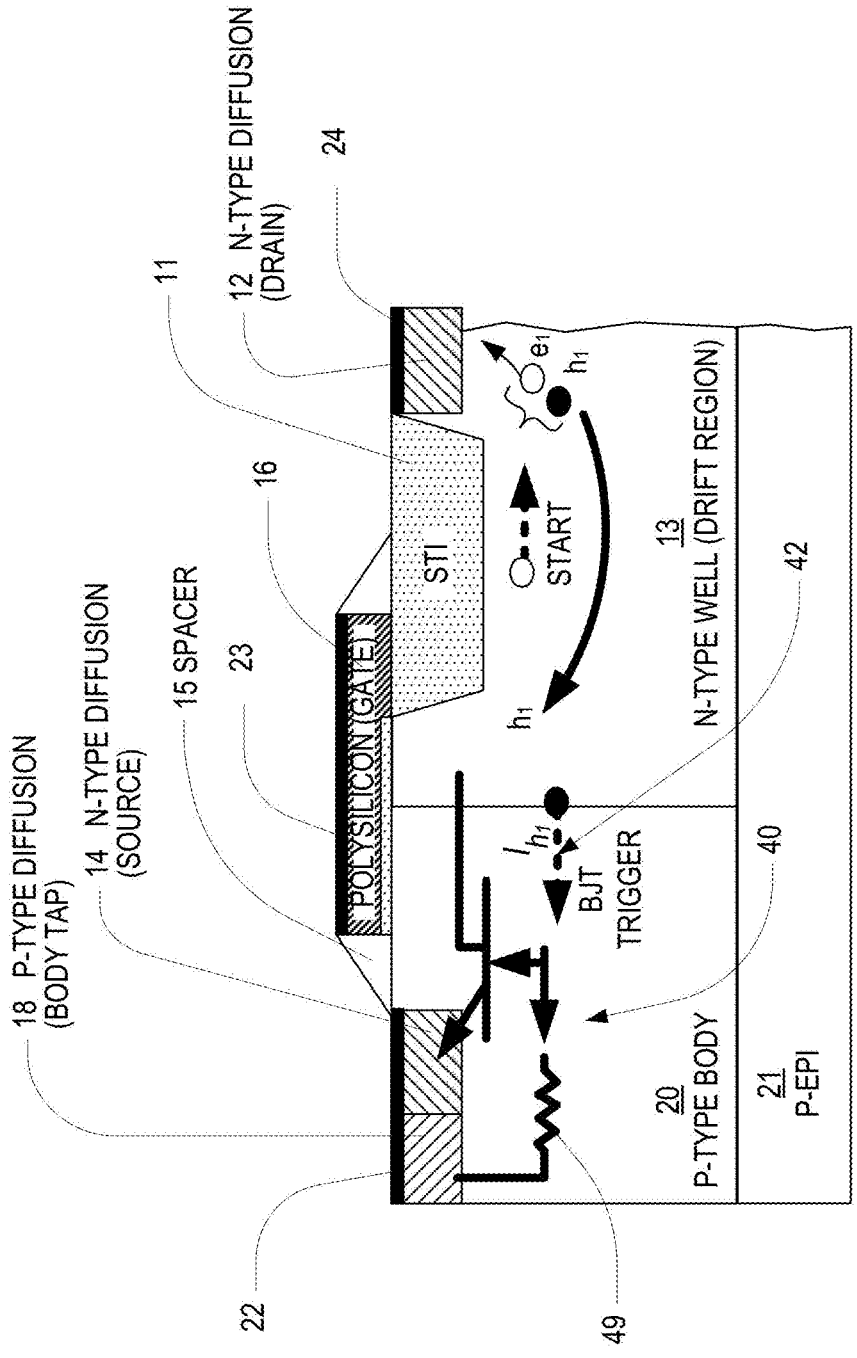
FIG. 1A is a cross-sectional view of an exemplary LDMOS device showing a parasitic BJT.
Figure 1B:
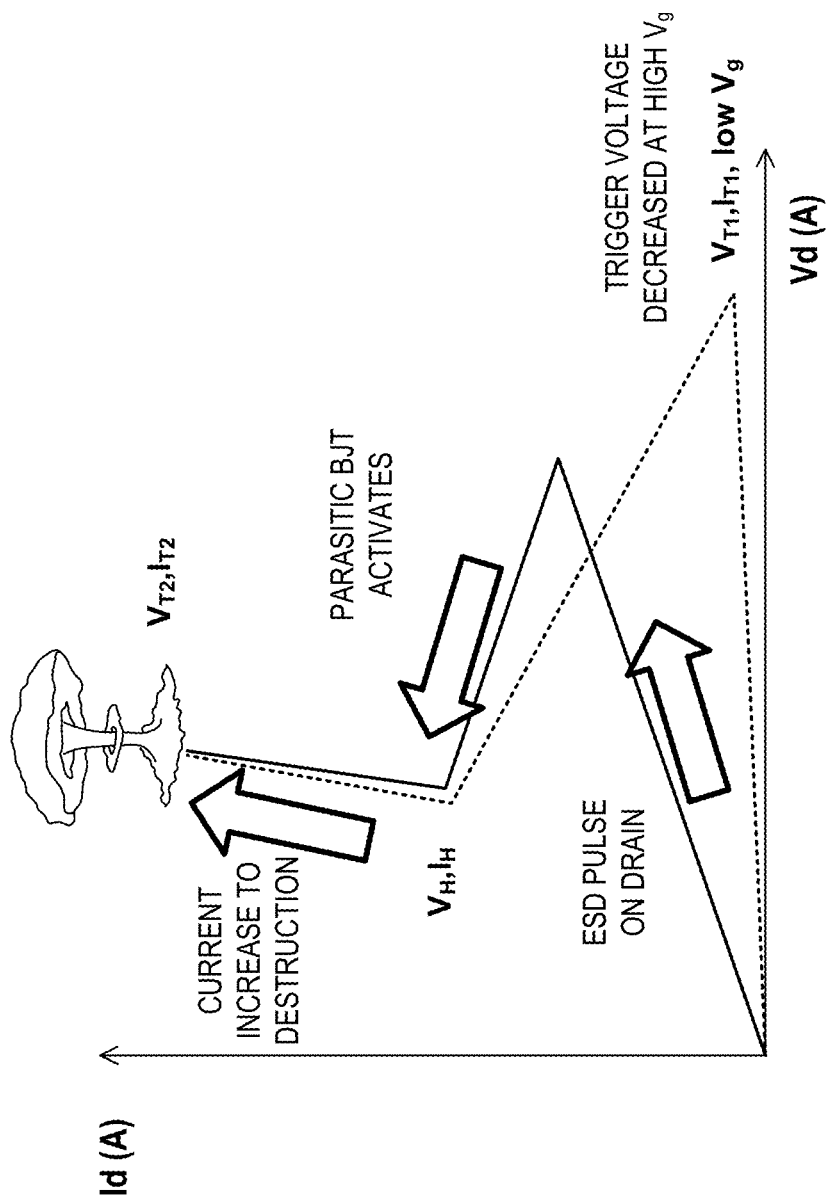
FIG. 1B is a graphical illustration of the stages of bipolar triggering and device destruction.
Figure 1C:
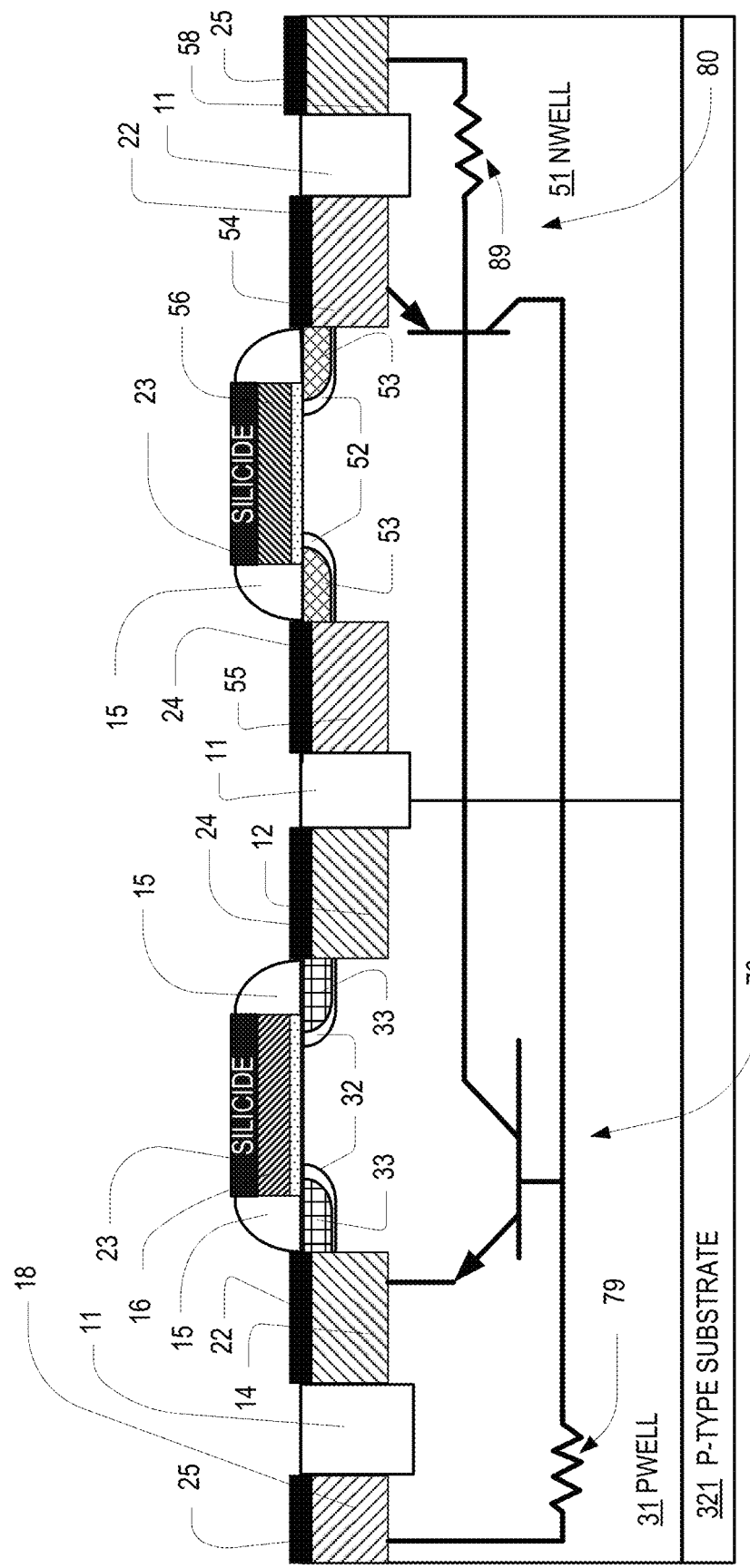
FIG. 1C is a cross-sectional view of an exemplary n-channel and p-channel CMOS device showing parasitic BJTs.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of the preferred embodiment(s) is merely exemplary in nature and is in no way intended to limit the invention, its application, or uses.

Figure 2:
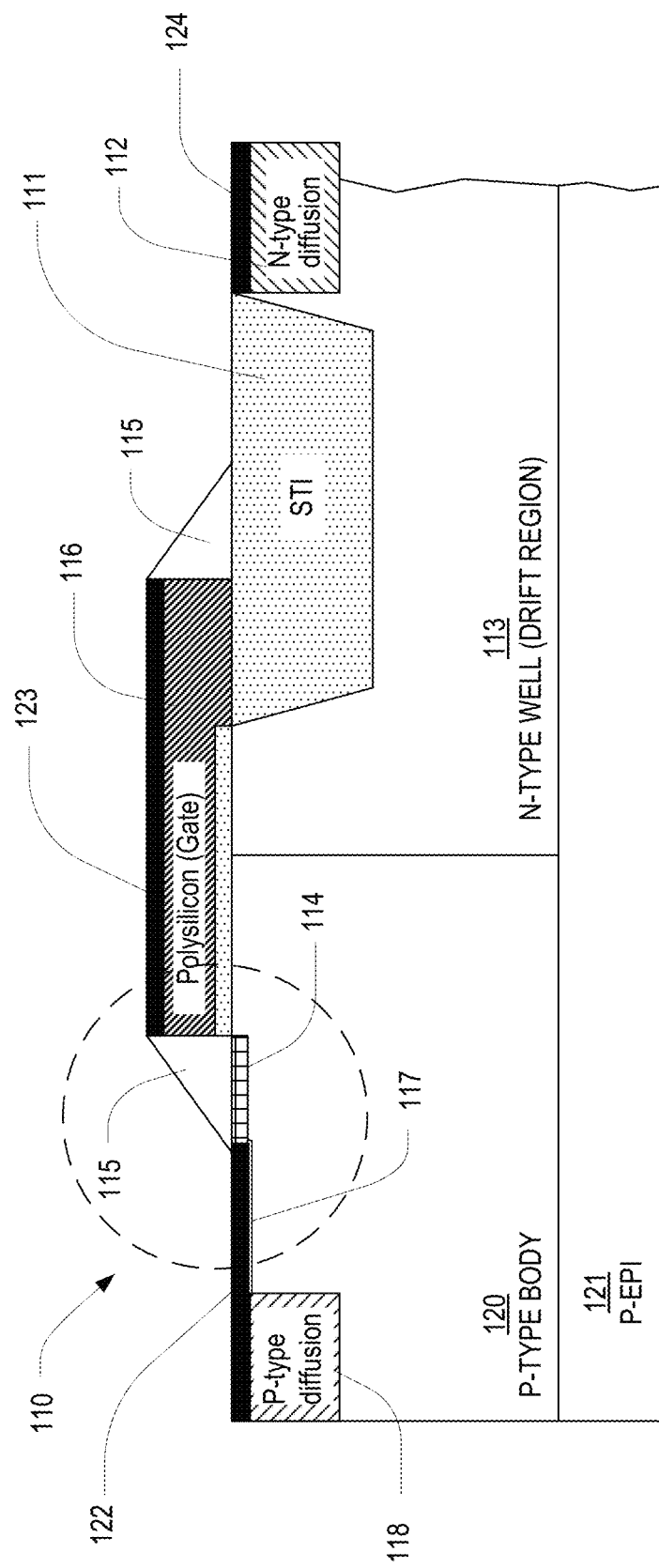
FIG. 2 is a cross-sectional view of an exemplary hybrid contact LDMOS device in accordance with one or more preferred embodiments of the present invention.

FIG. 2 is a cross-sectional view of an exemplary hybrid contact LDMOS device 100 in accordance with one or more preferred embodiments of the present invention. As with exemplary LDMOS device 10 of FIG. 1A, the LDMOS device 100 of FIG. 2 has a p-type substrate 121, a p-type body 120, an n-type well 113, a body tap 118, shallow trench isolation 111, a gate structure 116 (polysilicon on gate oxide) and gate sidewall spacer structure 115, a drain region 112, and ohmic contacts 123,124 at the gate and drain, respectively, formed by silicidation. In at least some embodiments, these elements are all of generally similar construction as those of the exemplary prior art LDMOS device 10 in FIG. 1A. Notably, however, the n-type diffusion 14 in the source region is no longer present. Furthermore, a hybrid contact 110, created from the placement of a hybrid contact implant 114 and subsequent silicidation of metal 122, replaces the original PN rectifying junction of the n-type diffusion to underlying p-type body. As described below, an interfacial dopant layer 117 may be created on or in the silicide 122.

Figure 3A:
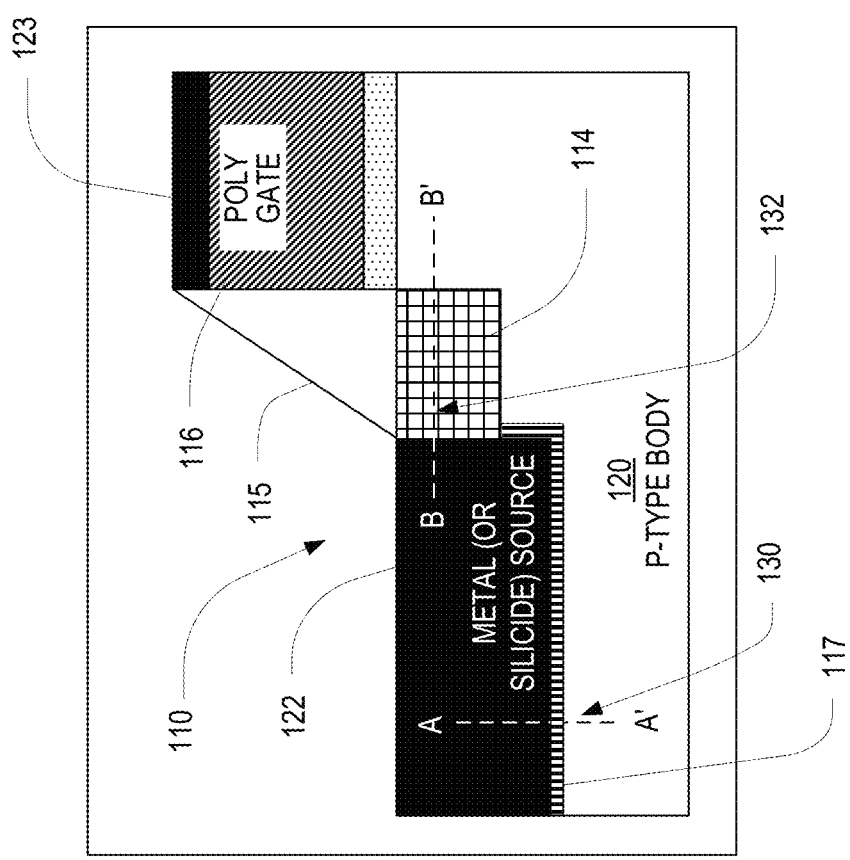
FIG. 3A is an enlarged cross-sectional view of the exemplary hybrid contact of the LDMOS device of FIG. 2.
Figure 3B:
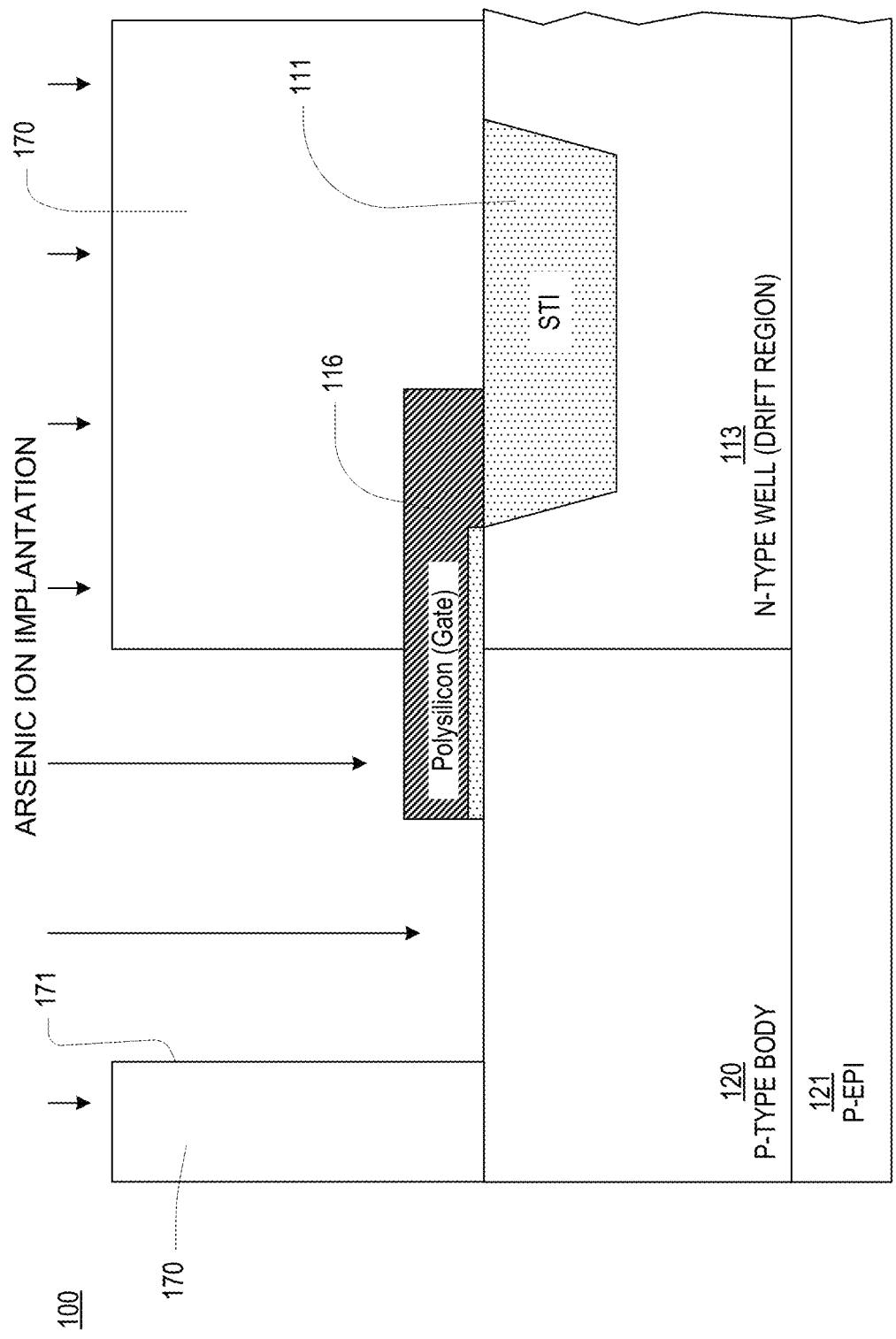
FIG. 3B is a cross-sectional view of the exemplary hybrid contact LDMOS device of FIG. 2 showing the use of a mask, formed by the combination of a photoresist coating and the gate structure (polysilicon on gate oxide), for the hybrid contact implant.

FIG. 3A is an enlarged cross-sectional view of the exemplary hybrid contact 110 of the LDMOS device 100 of FIG. 2. Notably, although illustrated in the context of the LDMOS device 100 of FIG. 2, it will be appreciated that in various preferred embodiments of the present invention, the hybrid contact 110 has applicability to other MOS devices as well. The hybrid contact 110 includes a hybrid contact implant 114, placed in a p-type body 120, and silicide metal 122 adjacent the hybrid contact implant 114. Notably, as perhaps best shown in FIG. 3A and mentioned above, the n-type diffusion in the source region 14 of the LDMOS device 10 in FIG. 1A is not present. Instead, a hybrid contact implant 114 having first and second portions is aligned to the gate structure 116 prior to the placement of a gate sidewall spacer structure 115 (which covers the first portion, as shown in FIG. 12C) and extended into the source region. FIG. 3B is a cross-sectional view of the exemplary hybrid contact LDMOS device 100 in FIG. 2 showing the use of a mask, formed by the combination of a photoresist coating 170 and the gate structure 116 (polysilicon on gate oxide), for the hybrid contact implant. The n-type diffusion 14 in the source region of the exemplary LDMOS device 10 creates a PN source-bulk junction. In the hybrid contact 110, the n-type diffusion in the source region has been omitted, leaving the silicide metal 122, including an interfacial dopant layer 117, on the p-type body region 120 creating a vertical, metal to p-type Schottky junction 130 (A-A'), whose barrier height has been modified by the second portion of the hybrid contact implant 114. The interfacial dopant layer 117 results from the displacement of the second portion of the hybrid contact implant (the portion not covered by the gate sidewall spacer structure in FIG. 12C) during silicidation. The first portion of the hybrid contact implant 114 ultimately creates an ohmic coupling region 132 (B-B') as shown in FIG. 3A. When the device is active, the vertical rectifying Schottky junction 130 (A-A') ensures minimal electron injection to the body when the source-body junction is forward biased. Laterally, the silicide metal interfaces with a shallow doped n-type semiconducting region to form an ohmic connection to the channel 132 (B-B'), which enables electrons to tunnel between the metal and semiconductor so as to obtain high current and low resistance.

Figures 3C, 3D:
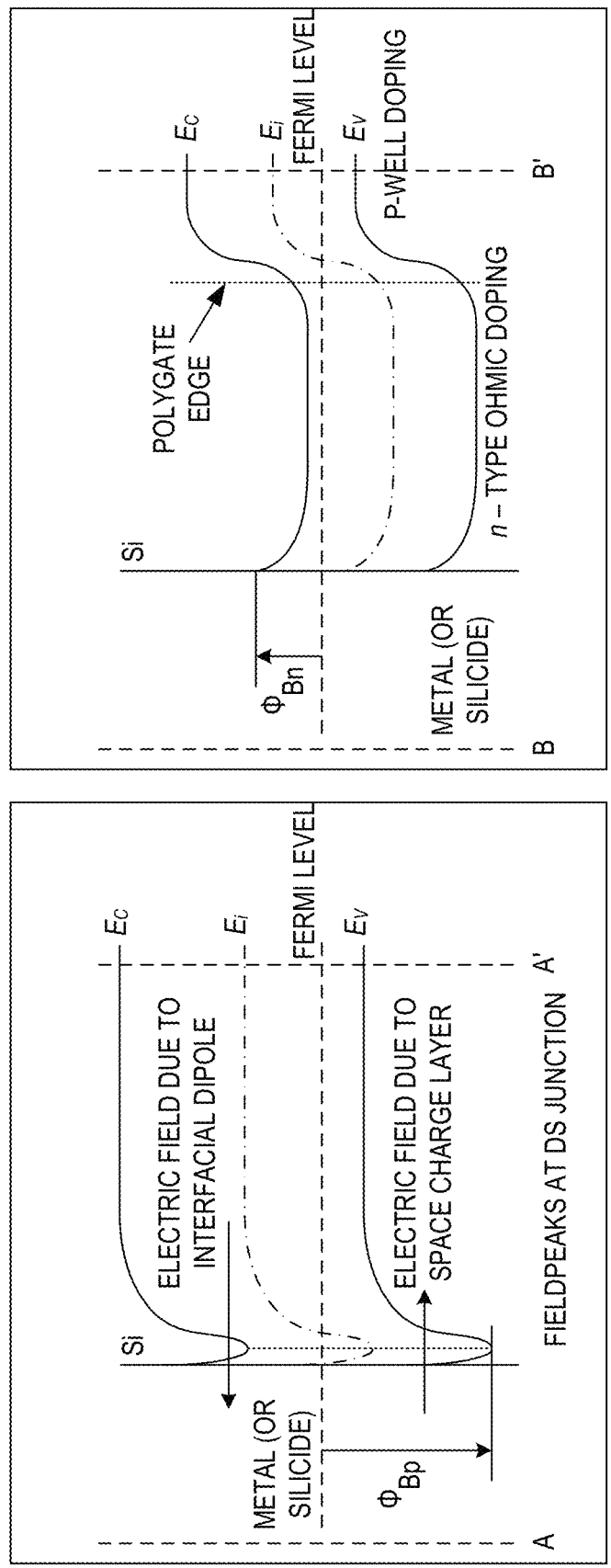
FIG. 3C is a band diagram of the n-type interfacial dopant layer vertical Schottky junction (A-A') region of the MOS device of FIG. 3A, with metal level near mid-gap on p-type substrate.
FIG. 3D is a band diagram of the lateral ohmic connection to the channel (B-B') region of the hybrid contact of FIG. 3A, with metal level near mid-bandgap on n-type silicon.

Together, the combination of the Schottky junction with the ohmic connection to the channel in a single contact creates the first preferred embodiment of a hybrid contact 110. FIG. 3C is a band diagram of the n-type interfacial dopant layer vertical Schottky junction 130 (A-A') region of the hybrid contact 110 of FIG. 3A, with metal level near mid-bandgap on p-type substrate, while FIG. 3D is a band diagram of the lateral ohmic connection to the channel 132 (B-B') region of the hybrid contact 110 of FIG. 3A, with metal level near mid-bandgap on n-type silicon.

Figure 3E:
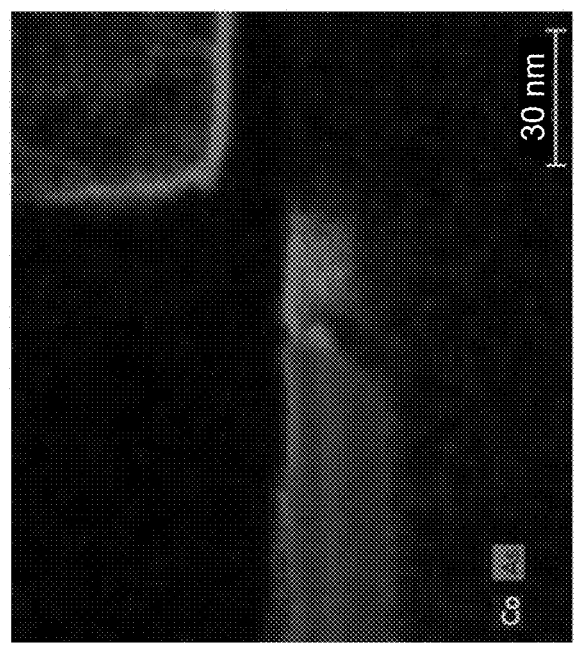
FIG. 3E is an Energy Dispersive X-ray Spectroscopy (EDS) image of the hybrid contact of FIG. 3A.

FIG. 3E is an Energy Dispersive X-Ray Spectroscopy (EDS) image of the hybrid contact 110 of FIG. 3A. This EDS image shows the position of the shallow implanted arsenic adjacent to the source silicide, resulting in a high concentration of arsenic under the gate sidewall spacer structure. Some of the arsenic from the second portion of the hybrid contact implant 114 can be seen on the top and interior of the cobalt silicide, while the arsenic in the interfacial dopant layer at the bottom of the silicide is below the detection limit of this instrument. The presence of "activated" interfacial dopant has been confirmed by changes in electrical characteristics—increased source junction turn-on voltage stemming from the increased barrier height.

Figures 4A, 4B:
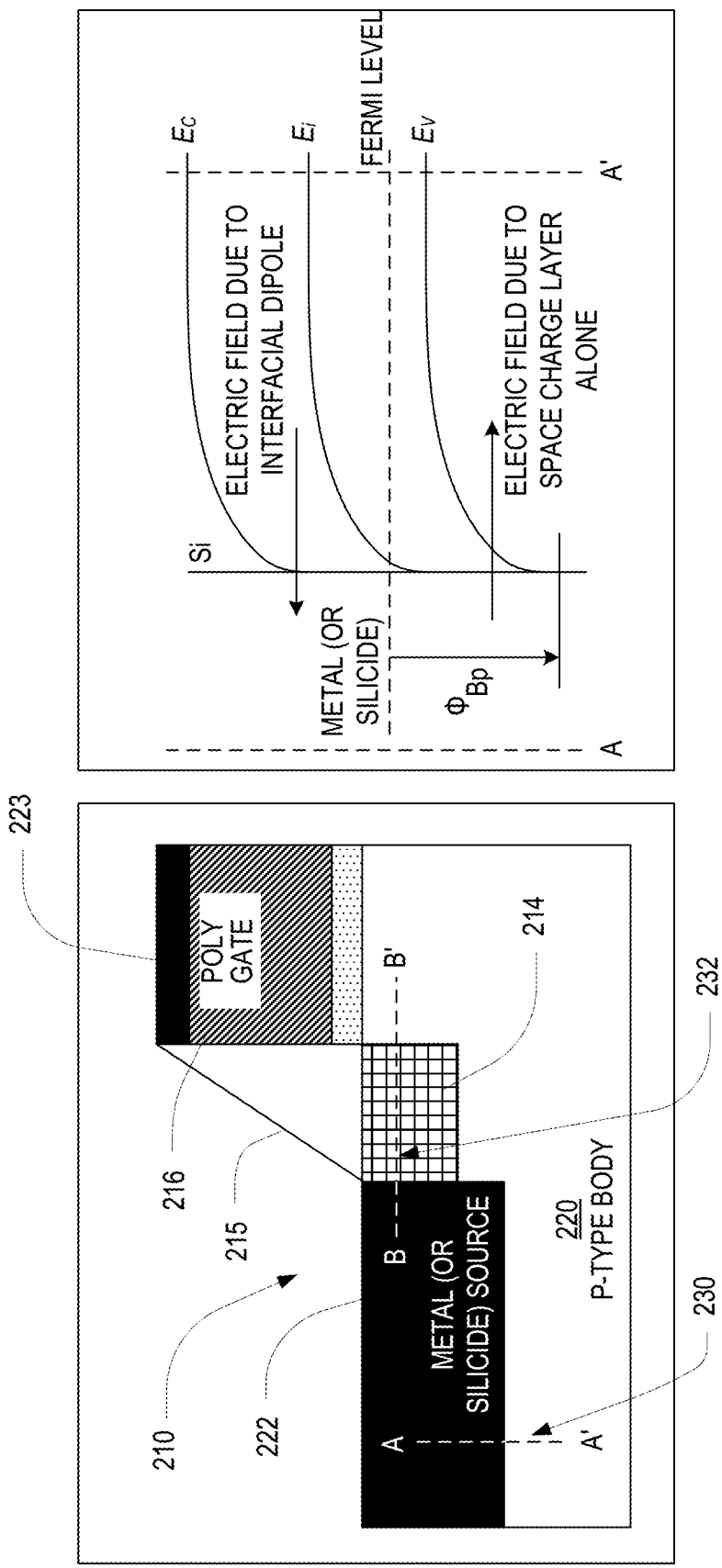
FIG. 4A is an enlarged cross-sectional view of an exemplary hybrid contact for use in a MOS device in accordance with one or more further preferred embodiments of the present invention.
FIG. 4B is a band diagram of the vertical classical Schottky band diagram for the A-A' region of the hybrid contact of FIG. 4A, with metal level near mid-bandgap on p-type substrate.

Notably, although the interfacial dopant layer 117 shown in FIG. 3A may advantageously be utilized to modulate the barrier height and turn-on voltage of the Schottky junction, resulting in a range for the turn-on voltage from 0.1V to 0.5V. The interfacial dopant layer may, in some embodiments, be omitted or completely subsumed into the metal silicide. In this regard, FIG. 4A is an enlarged cross-sectional view of an exemplary hybrid contact for use in a MOS device in accordance with one or more further preferred embodiments of the present invention. Similar to the hybrid contact 110 of FIG. 3A, the hybrid contact 210 includes a hybrid contact implant 214, placed in a p-type body 220, and silicide metal 222 adjacent the hybrid contact implant 214. Notably, as with the device 100 described above, the n-type diffusion in the source region 14 of the LDMOS device 10 in FIG. 1A is absent in this hybrid contact 210. Instead, as shown in FIG. 4A, a hybrid contact implant 214 is aligned to the gate structure 216 prior to the placement of a gate sidewall spacer structure 215. The n-type diffusion 14 in the source region of the exemplary LDMOS device 10 creates a PN source-bulk junction. In the hybrid contact 210, the deep n-type diffusion in the source region has been omitted, leaving the silicide metal 222 directly on p-type body region 220 creating a vertical, metal to p-type Schottky junction 230 (A-A'), whose fixed barrier height is effectively determined by the selected metal. The hybrid contact implant 214 also creates an ohmic coupling region 232 (B-B') as shown in FIG. 4A. When the device is active, the vertical rectifying Schottky junction 230 (A-A') ensures minimal electron injection to the body when the source-body junction is forward biased. Laterally, the silicide metal interfaces with a shallow doped n-type semiconducting region to form an ohmic connection to the channel 232 (B-B'), which enables electrons to tunnel between the metal and semiconductor so as to obtain high current and low resistance.

Together, the combination of the Schottky junction with the ohmic connection to the channel in a single contact creates another preferred embodiment of the hybrid contact 210. FIG. 4B is a band diagram of the vertical classical Schottky band diagram for the A-A' region of the hybrid contact 210 of FIG. 4A, with metal level near mid-bandgap on p-type substrate, while the band diagram of the lateral ohmic junction, B-B' region of the hybrid contact of FIG. 4A, remains generally similar to that of FIG. 3D.

Figure 5B:
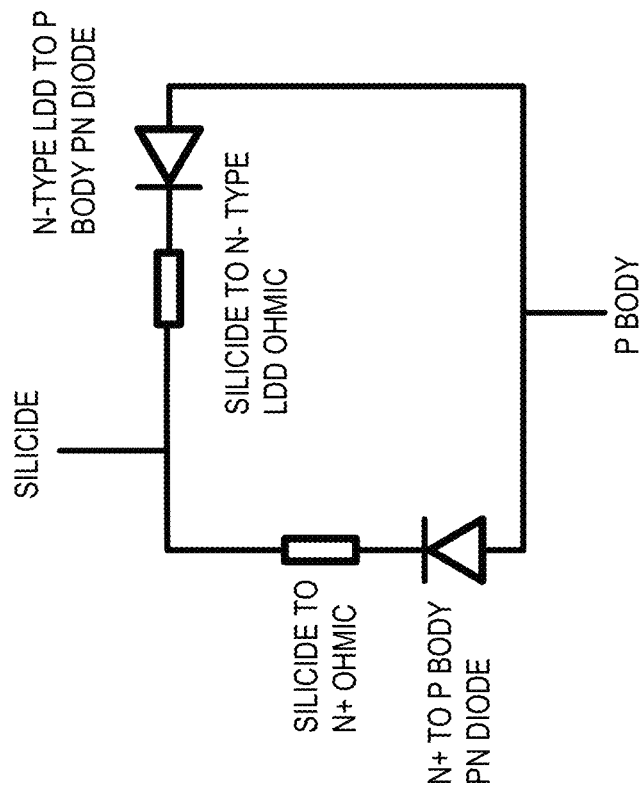
FIG. 5B is a circuit schematic of the source contact region of FIG. 5A, where the corresponding MOS device is in the off-state.
Figure 5A:
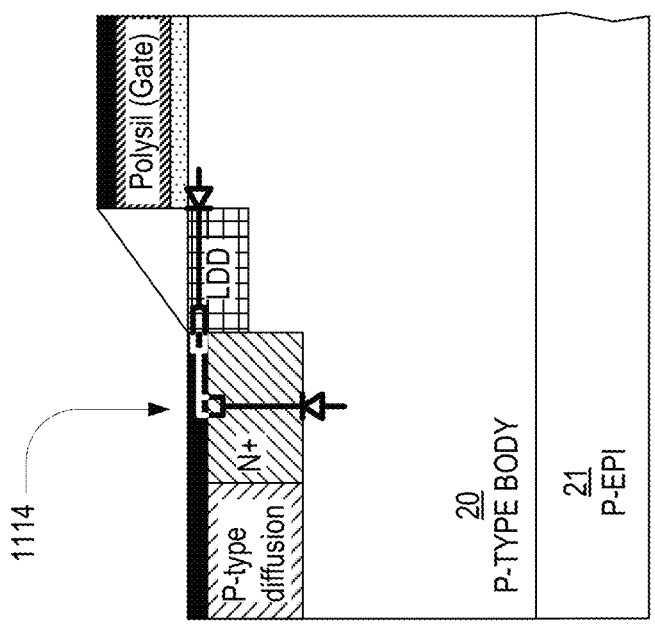
FIG. 5A is a cross-sectional view of the source contact region of FIG. 1A.
Figures 6A, 6B:
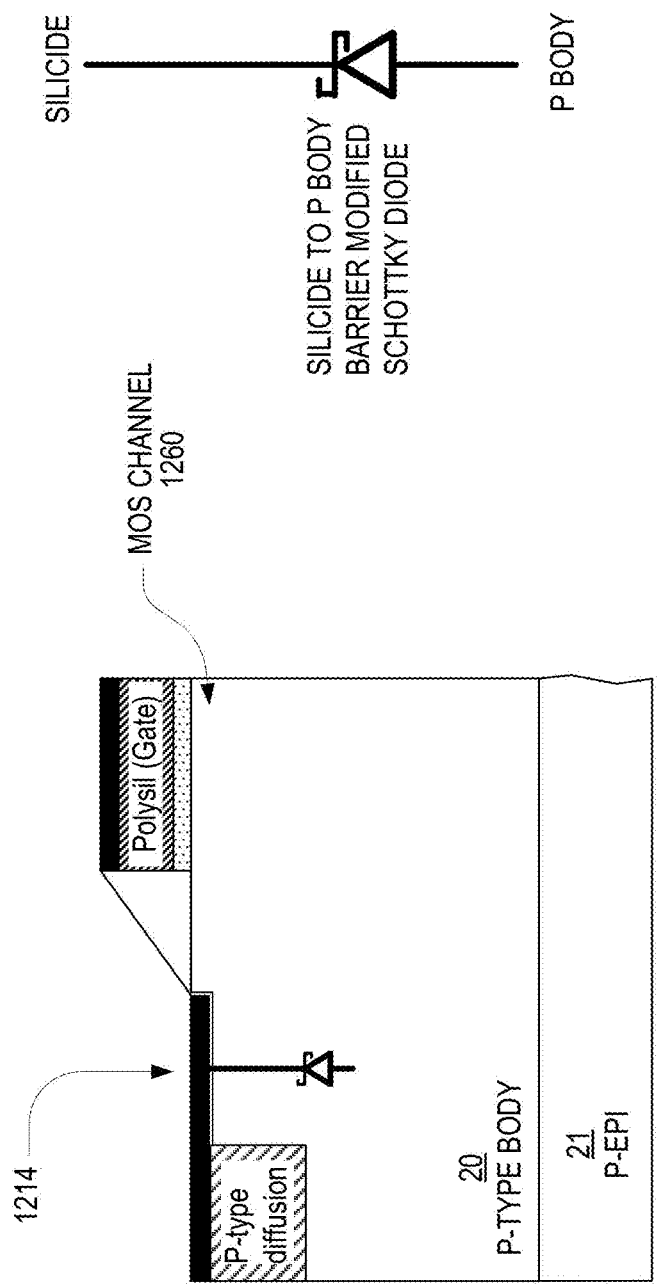
FIG. 6A is a cross-sectional view of a Schottky-only source contact region using a conventional spacer width.
FIG. 6B is a circuit schematic of the source contact region of FIG. 6A where the corresponding MOS device is in the off-state.
Figures 7A, 7B:
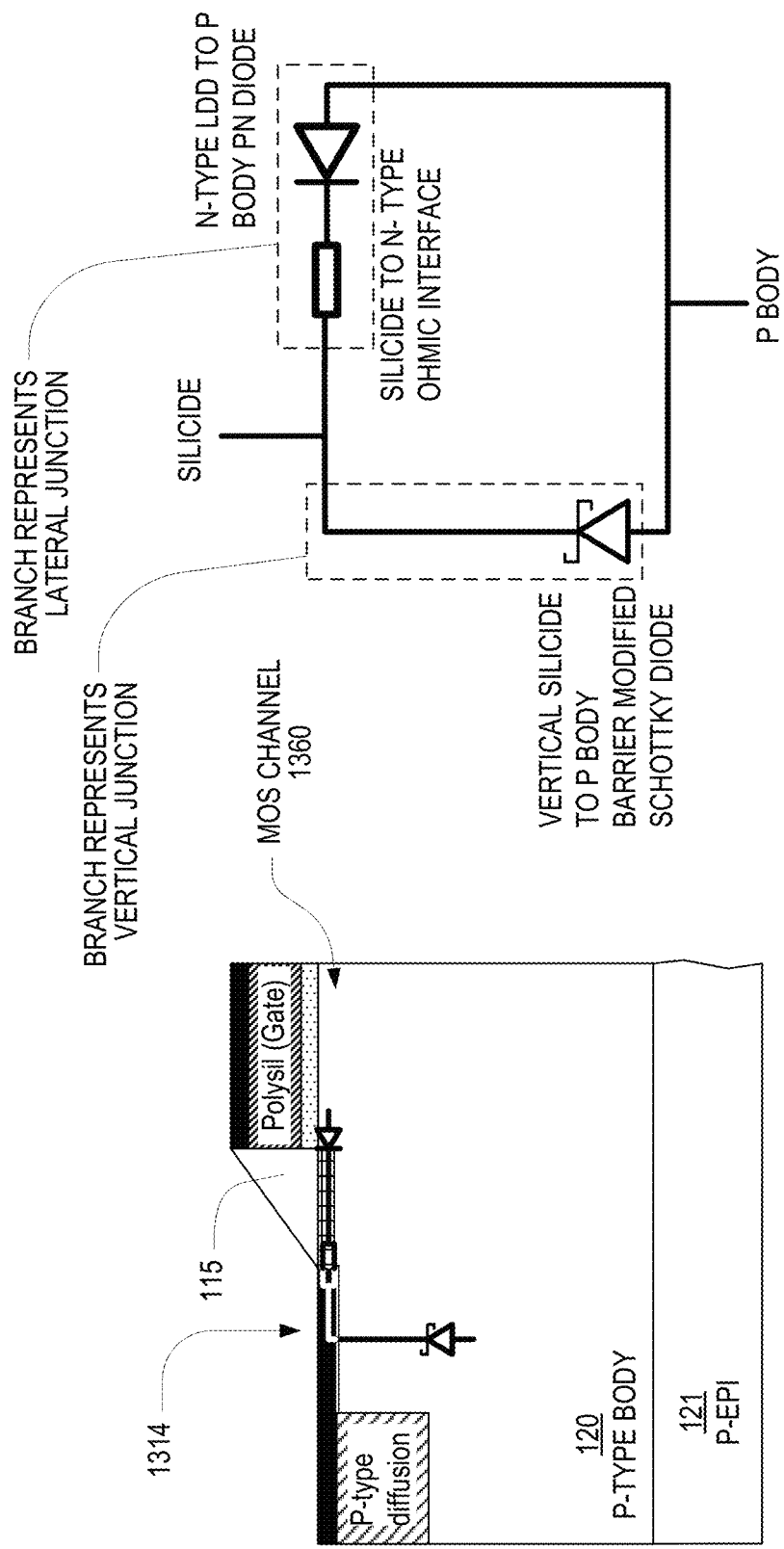
FIG. 7A is a cross-sectional view of the source contact region, featuring a hybrid contact, of FIG. 3A illustrating the Schottky and PN diodes with a resistor.
FIG. 7B is a circuit schematic of the source contact region, featuring a hybrid contact, of FIG. 7A where the corresponding MOS device is in the off-state.

FIGS. 5A, 5B, 6A, 6B, 7A and 7B depict a cross-sectional view and a circuit schematic for each of three source contact region scenarios, where the source contact region 1114, 1214, 1314 of each MOS device is in the off-state. More specifically, FIG. 5A is cross-sectional view of the source contact region of FIG. 1A and FIG. 5B is a circuit schematic of the source contact region 1114 of FIG. 5A, where the corresponding MOS device is in the off-state; FIG. 6A is a cross-sectional view of a Schottky-only source contact region using a conventional spacer width and FIG. 6B is a circuit schematic of the source contact region 1214 of FIG. 6A where the corresponding MOS device is in the off-state; and FIG. 7A is a cross-sectional view of the source contact region 1314, featuring a hybrid contact 110, of FIG. 3A illustrating the Schottky and PN diodes with a resistor and FIG. 7B is a circuit schematic of the source contact region 1314, featuring a hybrid contact 110, of FIG. 7A where the corresponding MOS device is in the off-state.

In each of FIGS. 5A, 6A, and 7A, the junctions formed in the respective source contact regions 1114,1214,1314, and their relative locations, are illustrated schematically. FIGS. 5A and 5B depict a conventional source contact region 1114 of FIG. 1A where no Schottky junction is present. FIGS. 6A and 6B illustrate a Schottky-only source contact region 1214 using a conventional spacer width resulting in little or no connection to the MOS channel 1260. FIGS. 7A and 7B illustrate the equivalent circuit of the preferred embodiment of FIG. 3A, a source contact region 1314 featuring a hybrid contact being formed from a metal silicide directly adjacent the hybrid contact implant and defining first, second and third electrical junctions, wherein the first electrical junction, a Schottky junction, is formed vertically between the silicide and the body, wherein the second electrical junction is an ohmic junction formed laterally from the silicide to the hybrid contact implant region under the spacer, and wherein the third electrical junction is a rectifying PN junction between the hybrid contact implant region and the channel region 1360. These three junctions, at these defined locations, constitute the hybrid contact 110, wherein the combination of the Schottky and PN diodes with a resistor results in a unique behavior. The vertical Schottky junction enables a trade-off between device leakage and BJT suppression. The PN diode from the hybrid contact implant, which in one preferred embodiment is a shallow doped n-type region, to the channel 1360 provides a normal rectifying connection between the shallow doped region and channel. The lateral ohmic connection observed when the device is in the on-state provides evidence that the Schottky barrier height has been overcome—enabling high current drive. Comparing the equivalent circuits in FIGS. 5B, 6B, and 7B, it can be seen that the hybrid contact source circuit of FIG. 7B differs from both the conventional source circuit (FIG. 5B) and the Schottky-only source circuit (FIG. 6B). When the MOS device is in the on-state, the lateral region of the hybrid contact under the gate sidewall spacer structure 115 coupling the source contact region 1314 to the channel 1360 enables high current drive, which is not the case for the Schottky-only source contact region 1214.

Notably, although the Schottky junction in each of FIG. 6A and FIG. 7A contains an interfacial dopant layer modifying the barrier height, the junction may alternatively be formed by a metal to semiconductor junction with a fixed barrier height.

Historically, implants have been customized by choosing species, dosage and energy to achieve specific connections and electrical effects within a semiconductor device. For MOSFETs, one goal is to create low-resistance contact regions at the source and drain terminals which are typically metal or silicide coupled to a degenerately or highly doped p or n type implant. In one example, for scaled CMOS devices, conventional Lightly Doped Drain (LDD) extension implants are aligned to the polysilicon gate edge. The LDD is often utilized primarily in low power CMOS devices to reduce short-channel effects (SCE) such as punch-thru and to mitigate Hot Carrier Injection (HCI) effects on the drain. In another example, the highly doped deep source/drain regions are placed farther away from the channel by engineering appropriate spacer width structures. Since CMOS devices operate symmetrically, LDD extensions are normally placed on both the source and drain regions to provide electrical connectivity between the contact deep source/drain regions and the device channel. Their principal purpose on the drain side is for when the drain-to-source voltage (VDS) is large, leading to the SCE mentioned above. The LDD implant is typically performed in conjunction with the deep source/drain implant, though separate masks and implant conditions are usually used. It is important to note that the implants in these two regions are customized for specific purposes and are implanted separately. Often times, multiple implants of different species may be used for both the deep source/drain and the LDD implants to finely tune the SCE behavior of the MOSFETs. By contrast, in the case of the hybrid contact, a single implant and single mask are used to achieve two different specific electrical connections in the same device; (1) a tuned Schottky junction between the source or drain contact and the body or well, and (2) an ohmic connection between the source or drain contact and the channel.

The as-implanted dopant will have a vertical Gaussian distribution. In order to create an interfacial dopant layer at the bottom of the silicide, which can be utilized to adjust the junction between Schottky and PN characteristics, the "shallow" depth of the implant is preferably from zero<as-implanted Gaussian peak<silicide depth, where zero is the original silicon surface, and the silicide depth is determined after the silicidation anneal(s). In one preferred embodiment, the silicide depth is approximately 30 nm.

With the hybrid contact 110 of FIG. 3A and 210 of FIG. 4A, the hybrid contact implant—a shallow doped area, which in at least some embodiments is an arsenic implant—is placed prior to the gate sidewall spacer structure, on the source side of the LDMOS device 100 and not in conjunction with a deep diffusion 14 (source implant), as depicted in FIG. 1A. In the embodiment of FIG. 3A, the hybrid contact implant 114 can be created using a single implant and single mask 170. The hybrid contact implant region as shown in FIG. 3B extends from the edge of the photoresist 171 to the left edge of the gate structure 116. The implant energy is sufficiently low so as not to penetrate through the polysilicon gate. After formation of the gate sidewall spacer, the contact silicide is deposited. In one preferred embodiment, the metal is sputtered over the silicon wafer. When it is annealed a silicide is formed on the regions where this metal is in contact to silicon. In regions where the metal lands on oxide, no silicide is formed. During silicidation, the silicide grows into the silicon and the second portion of the hybrid contact implant, under the contact silicide, is pushed (or snowplowed) ahead of the deepening silicide to form an interfacial dopant layer. The first portion of the hybrid contact implant, under the spacer, is of sufficient doping concentration, preferably greater than 1e19 atoms per cubic centimeter, to ensure an ohmic interface with the freshly grown silicide. The single hybrid contact implant creates both a vertical, Schottky barrier junction at the bottom of the silicide and a lateral, ohmic connection to the channel under the spacer, as shown in hybrid contact 110.

As shown in the embodiment of the hybrid contact in FIG. 4A, the source region is so lightly doped, that the interfacial dopant layer may be of sufficiently low concentration as to result in a hybrid contact 210 with little or no effect on the electrical behavior of the Schottky junction. In other embodiments of the hybrid contact, the hybrid contact implant can be formed using multiple masks or a more elaborate anneal schedule to create areas of lower dopant concentration or no dopant in the area outside the spacer.

The formation of the hybrid contact 110,210 in an LDMOS device 100 impacts at least three different characteristics of the device behavior: device leakage, ESD behavior and DC performance. As shown in FIG. 3A and FIG. 4A, the hybrid contact implant under the spacer forms an ohmic connection to the channel 132,232 (B-B') which enables high drive current. It is believed that the best case for suppression of the parasitic bipolar junction transistor (BJT) to improve ESD performance is when the Schottky junction 130,230 (A-A') is a metal to semiconductor junction (fixed barrier height containing no dopant) as in FIG. 4A, while an interfacial dopant layer can be formed by snowplow effect (FIG. 3A) to modulate the barrier height of the Schottky junction and reduce the electron injection efficiency. With an interfacial dopant layer, modifying process variables such as the hybrid contact implant energy and/or dose and the silicide anneal conditions enables a trade-off between ESD performance and leakage/drive current.

Recent work on the formation of the vertical Schottky junction has provided greater understanding with respect to how it is formed, especially given the presence of implanted arsenic. In at least some embodiments, its form is a function of at least three steps.

First, a shallow implant is used whose projected depth is less than that of the silicide depth (in at least some embodiments, about 30 nm). Arsenic is an excellent choice for this implant because it is a heavy ion that does not penetrate deep into the silicon, and thus with a manufacturable implant energy, a shallow implant can be readily achieved. In other embodiments, a similar heavy ion may be used and placed slightly deeper or shallower in the silicon, allowing a range in Schottky barrier height and ohmic connection to the channel.

Second, the arsenic is snowplowed in front of the growing silicide. The solid solubility of arsenic in cobalt silicide is quite low, less than 10e18 per cubic centimeter. As the silicide forms, it cannot absorb the implanted arsenic, and therefore this arsenic gets pushed in front of the silicide, which is referred to as the "snowplow" effect. This creates a high concentration of arsenic at the silicide to silicon interface. The difference in solid solubility between cobalt silicide and silicon dictates this behavior.

Third, the snowplowed arsenic diffuses into the silicide. Fick's laws dictate that dopants should diffuse from areas of high concentration to areas of lower concentration. With sufficient thermal budget, this is what happens to the high concentration of snowplowed arsenic described herein. The primary thermal budget for this is likely the transformation anneal for the silicide.

Figure 8A:
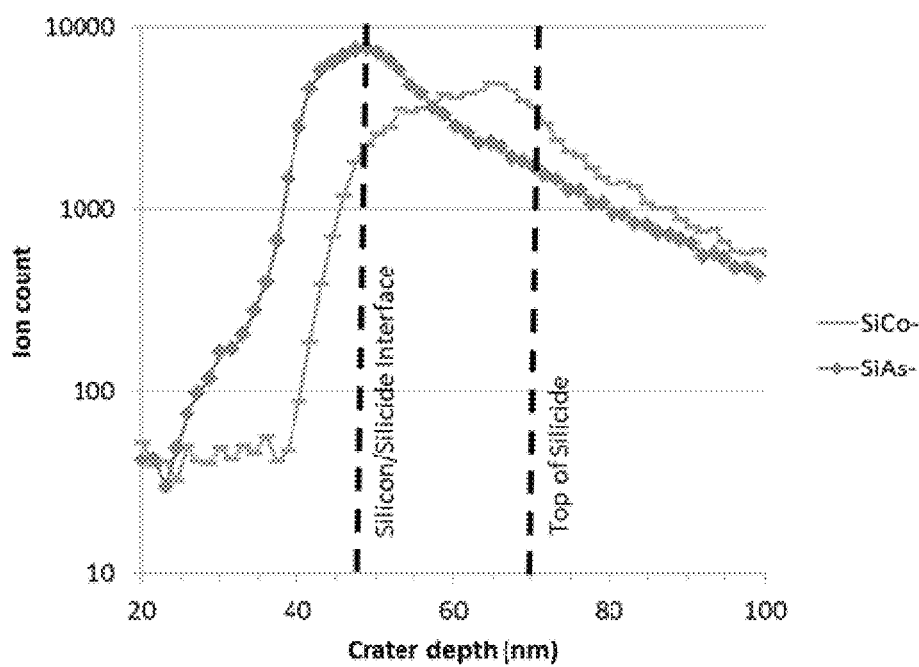
FIG. 8A is a graph showing the migration of arsenic during the experimental process after silicide formation.
Figure 8B:
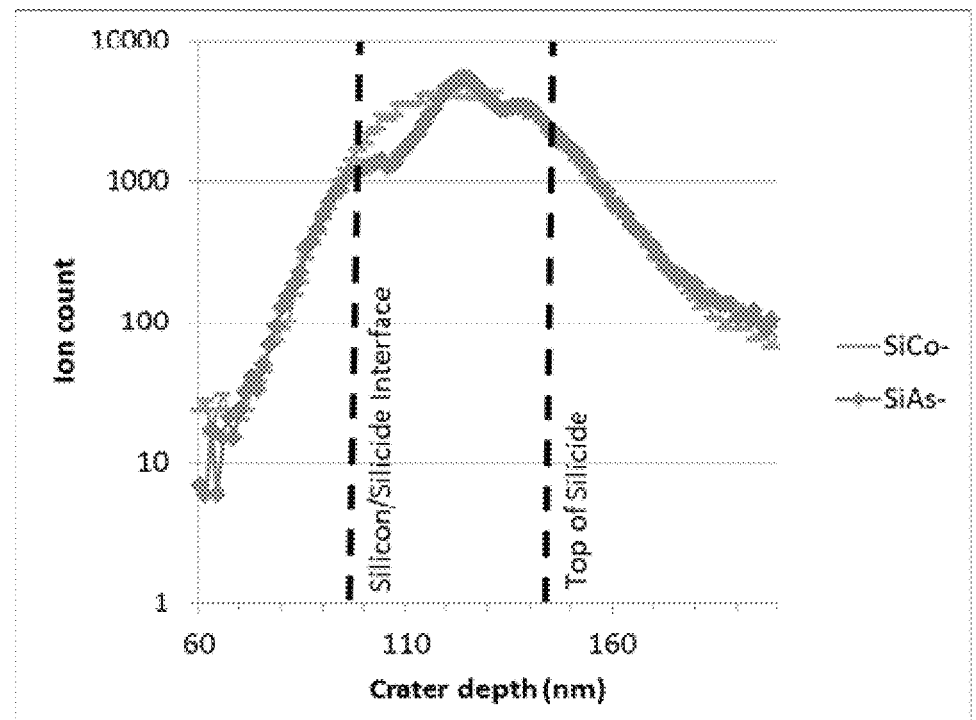
FIG. 8B is a graph showing the migration of arsenic after a second anneal when the wafer is complete.

The second and third steps have been observed during experimentation by using Secondary Ion Mass Spectroscopy (SIMS). In this regard, FIGS. 8A and 8B are graphs illustrating the migration of arsenic during a preferred manufacturing process, wherein the metal is placed on the silicon and a two-step anneal process is carried out. FIG. 8A illustrates the migration of arsenic during the experimental process after silicide formation, wherein the metal is placed on the silicon and the first anneal is done, with the graph showing an accumulation of arsenic (from snowplowing) under the silicide. FIG. 8B shows the migration of the arsenic after the second anneal when the wafer is complete. (In such a process, the second anneal changes the phase of the silicide to reduce its resistance.) At the end of the experimental process, some of the arsenic has diffused into the silicide, leaving a shallow, abrupt junction of activated arsenic at the silicon/silicide interface. The reason for this is the high diffusivity of arsenic in cobalt silicide. Arsenic can diffuse about 6 decades faster in cobalt silicide than in silicon. Notably, FIGS. 8A and 8B reflect experimental results. To some extent, actual results will be a function of other process factors, and plots of these experimental steps may vary considerably from those shown therein.

An LDMOS device 100 utilizing a hybrid contact 110,210 like those of FIGS. 3A and 4A offers various useful electrical characteristics. These include, for example, a significant improvement in the Transmission Line Pulsing (TLP) characteristics, especially for very fast pulses (1 ns and 2.5 ns). Also, a "square E-SOA" can be achieved, whereby no reduction in the trigger voltage is seen with higher gate voltage. This is helpful in maintaining a large ESD design window for designers.

Combining a highly doped body/well, as is traditionally used to suppress the parasitic BJT, in conjunction with a hybrid contact at the source creates a no-snapback LDMOS device 100. This feature can be utilized by customers to optimize their ESD clamp designs, thereby reducing chip area. However, if cost of fabrication is a concern over chip area, the hybrid contact can be used in place of the highly doped well to save on the cost of added implants.

Figure 9:
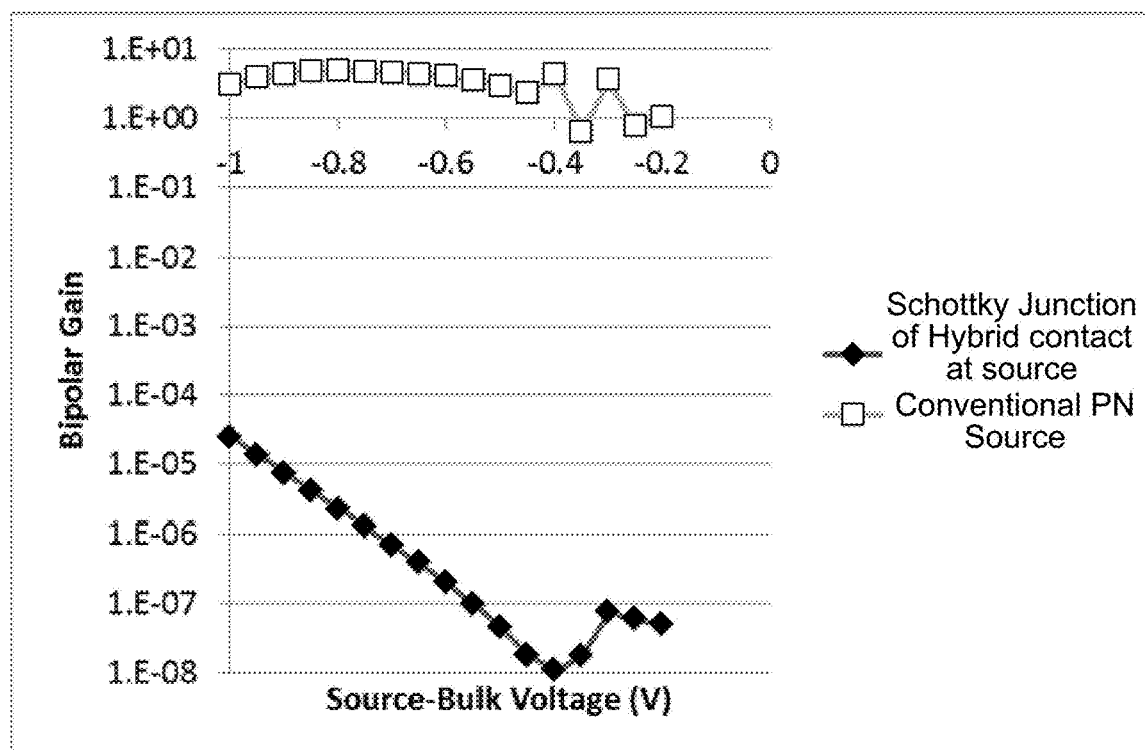
FIG. 9 is a graph comparing the lateral BJT gain for the hybrid contact on the source of the LDMOS device of FIG. 2 to that for a conventional source in an LDMOS device like that of FIG. 1A.

FIG. 9 is a graph comparing the lateral BJT gain for the hybrid contact 110 on the source of the LDMOS device 100 of FIG. 2 to that for a conventional source in an LDMOS device like that of FIG. 1A. This gain is obtained from a dedicated test structure with a separate source bulk. In this structure, the source/bulk junction is forward biased and all terminal currents measured. The bipolar gain is defined as the collector current (drain current) divided by the base (bulk) current. A bipolar gain less than one significantly reduces activation of the parasitic BJT. As seen in FIG. 9, the gain at the Schottky junction 130 of the hybrid contact on the source region of an LDMOS 100 is several decades lower, indicating that the BJT has been suppressed. This being the case, improvement should be seen in the TLP results in the absence of bipolar snapback.

Figure 10:
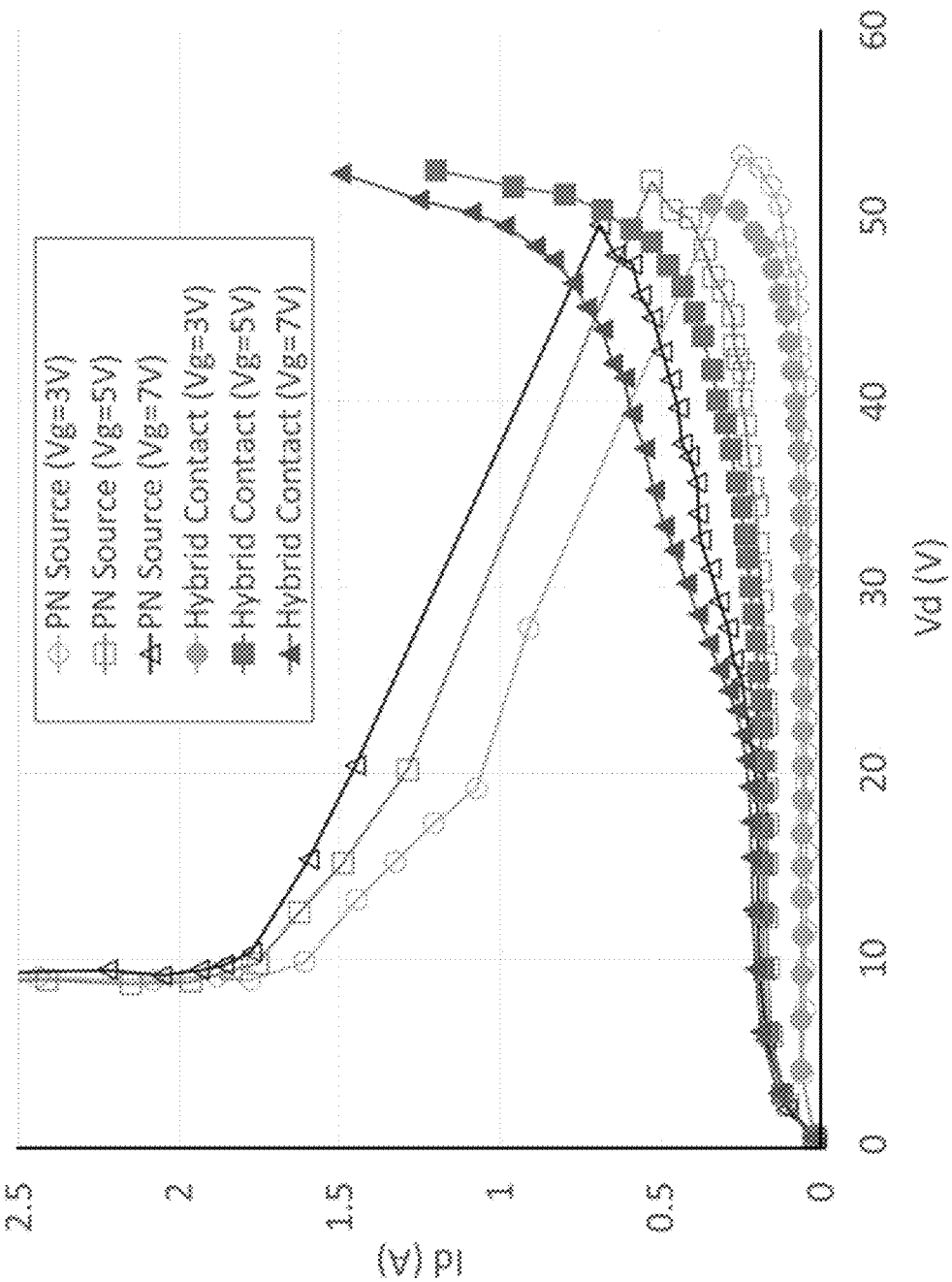
FIG. 10 is a graph comparison of 2.5 ns TLP results between a conventional LDMOS with a PN source (FIG. 1A) and the hybrid contact LDMOS (FIG. 2)

FIG. 10 is a graph comparison of 2.5 ns TLP results between a conventional LDMOS with a PN source (FIG. 1A) and the hybrid contact LDMOS (FIG. 2). The graph shows no snapback with the Schottky junction of the hybrid contact.

Figure 11A:
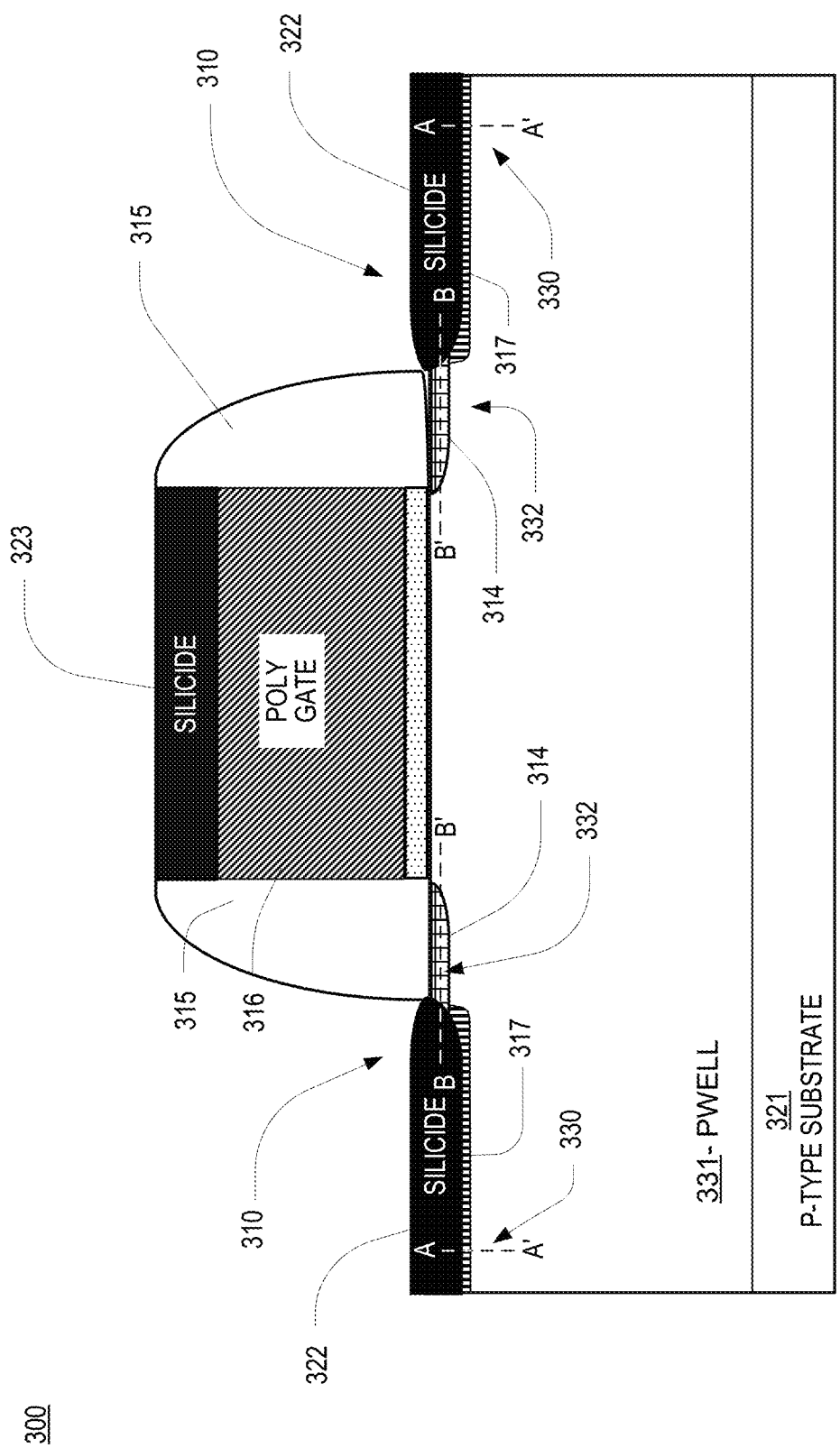
FIG. 11A is a cross-sectional view of an n-channel CMOS device with hybrid contacts in accordance with one or more further preferred embodiments of the present invention.
Figure 11B:
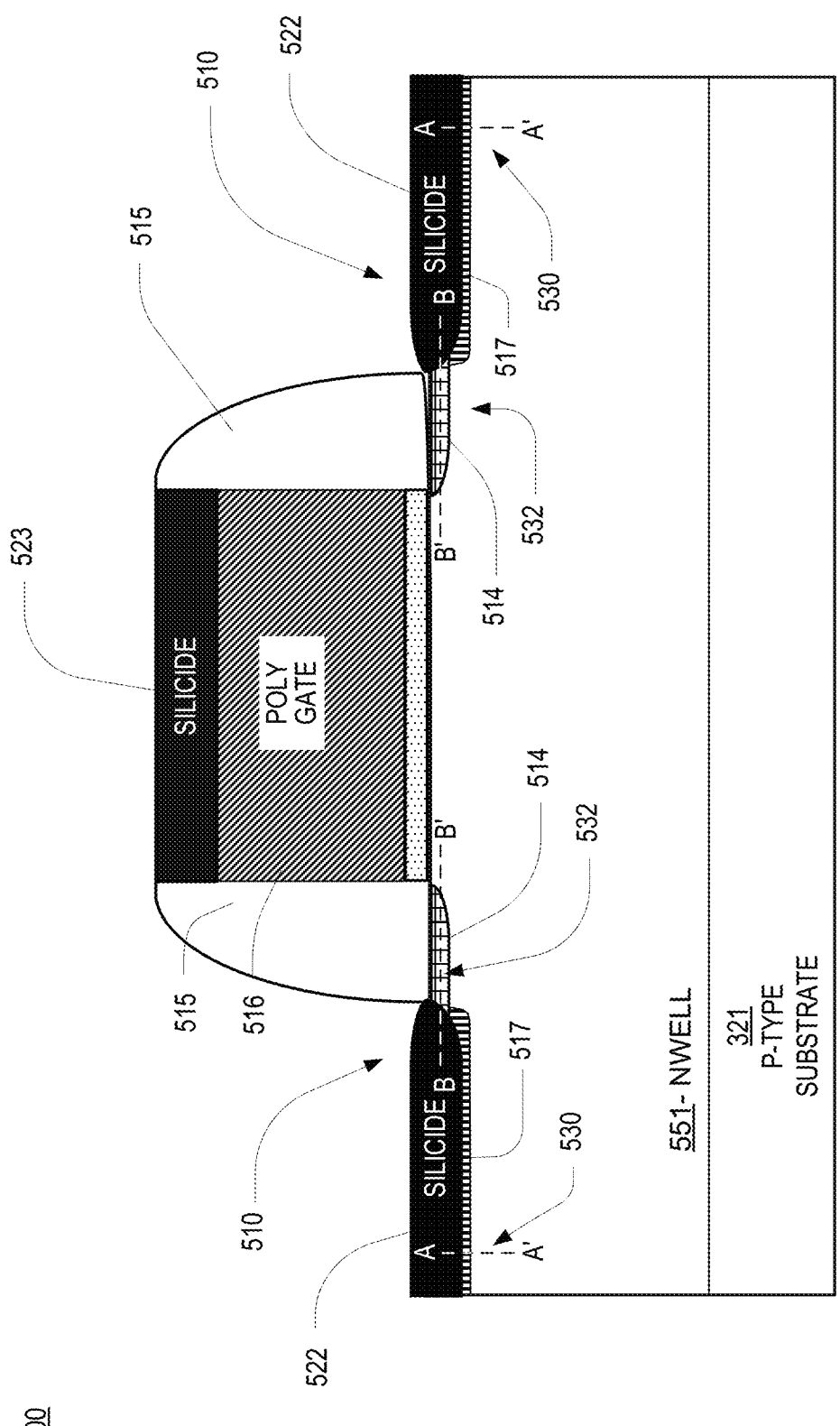
FIG. 11B is a cross-sectional view of an p-channel CMOS device with hybrid contacts in accordance with one or more further preferred embodiments of the present invention.

In some embodiments, the invention is not limited to LDMOS devices, but has applicability for various other MOS devices. In this regard, FIGS. 11A and 11B are cross-sectional views of an n-channel (NMOS) CMOS device 300 and a p-channel (PMOS) CMOS device 500, respectively, with hybrid contacts 310,510 in accordance with another preferred embodiment of the present invention. Notably, while the NMOS and PMOS devices 300,500 are defined as a dual well process, it will be understood by those skilled in the art that various embodiments can be implemented in single well processes.

The NMOS device 300 of FIG. 11A has a p-type substrate 321, a p-type well 331, a gate structure 316, a gate sidewall spacer structure 315, undesignated source and drain regions, and an ohmic contact 323 at the gate created by silicide placement. In this device 300, in both the source and drain region, hybrid contacts 310 replace the ohmic contacts that would conventionally be utilized. In the hybrid contact 310, the n-type diffusions in the source and drain regions have been omitted, leaving the silicide metal 322, including an interfacial dopant layer 317, on the p-type well 331 creating a vertical, metal to p-type Schottky junction 330 (A-A') region, whose barrier height has been modified by the hybrid contact implant 314. The interfacial dopant layer 317 results from the displacement of the hybrid contact implant 314 during silicide growth. In at least some preferred embodiments, the hybrid contact implant 314 is a shallow arsenic implant. The hybrid contact implant 314 also creates an ohmic coupling 332 (B-B') region. When the device is active, the vertical rectifying Schottky junction 330 (A-A') ensures minimal electron injection when the source/drain to p-type well junction is forward biased. Laterally, the silicide metal interfaces with a shallow doped n-type semiconducting region to form an ohmic connection to the channel 332 (B-B'), which enables electrons to tunnel between the metal and semiconductor so as to obtain high current and low resistance.

The PMOS device 500 of FIG. 11B has a p-type substrate 321, an n-type well 551, a gate structure 516, gate sidewall spacer structure 515, undesignated source and drain regions, and an ohmic contact 523 at the gate created by silicide placement. In this device 500, in both the source and drain region, hybrid contacts 510 replace the ohmic contacts that would conventionally be utilized. In the hybrid contact 510, the p-type diffusion in the source region has been omitted, leaving the silicide metal 522, including an interfacial dopant layer 517, on the n-type well 551 creating a vertical, metal to n-type Schottky junction 530 (A-A') region, whose barrier height has been modified by the hybrid contact implant 514. The interfacial dopant layer 517 results from the displacement of the hybrid contact implant 514 during silicide growth. In one preferred embodiment, the hybrid contact implant 514 is a shallow boron implant. The hybrid contact implant 514 also creates an ohmic coupling 532 (B-B') region. When the device is active, the vertical rectifying Schottky junction 530 (A-A') ensures minimal hole injection when the source/drain to n-type well junction is forward biased. Laterally, the silicide metal interfaces with a shallow doped p-type semiconducting region to form an ohmic connection to the channel 532 (B-B'), which enables electrons to tunnel between the metal and semiconductor so as to obtain high current and low resistance.

It will be understood by those skilled in the art that various embodiments can be implemented in substrate wafer materials commonly used in the semiconductor industry including, bulk silicon (n and p type), Partially Depleted (PD) SOI, epitaxial silicon and the like. The objective is to be able to build a vertical Schottky junction between the silicide of the hybrid contact and the body/well region, as well as a lateral ohmic connection between the silicide of the hybrid contact at the source and/or drain regions and the MOS channel formed by the gate. Arsenic and boron are used in some preferred embodiments, but other n-type and p-type implants with similar weights and diffusivity relative to the chosen silicide could also be used. Finally, it will be appreciated that while cobalt silicide is used, other silicides could also be used.

Throughout the discussion herein, there are examples provided that make reference to a rectifying Schottky barrier junction. The present invention does not recognize any limitations in regards to what types of Schottky interfaces may be used and specifically anticipates these types of junctions to be created with any form of conductive material. Additionally, while traditional Schottky junctions are abrupt, the present invention specifically anticipates that in some circumstances an interfacial layer may be utilized between the silicon substrate and the actual conductive material. Furthermore, the interfacial layer may comprise materials that have conductive, semi-conductive, and/or insulator-like properties. A preferred embodiment is using dopant segregation techniques to form an interfacial dopant layer between the silicon substrate and the silicide.

Figure 12B:
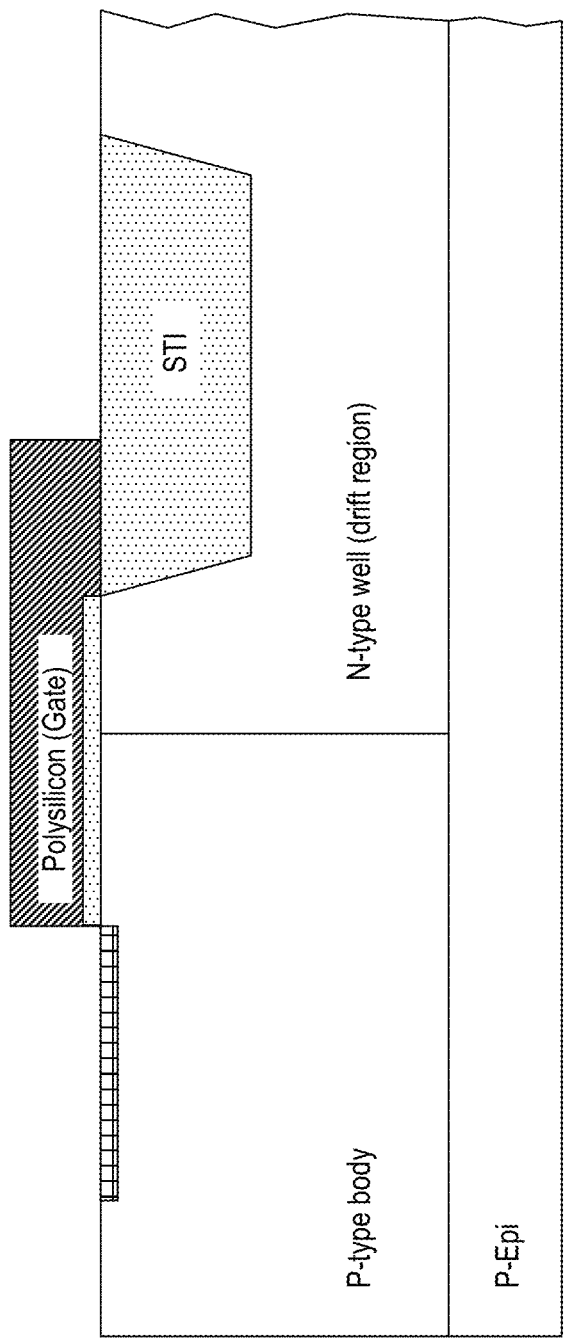
Figure 12E:
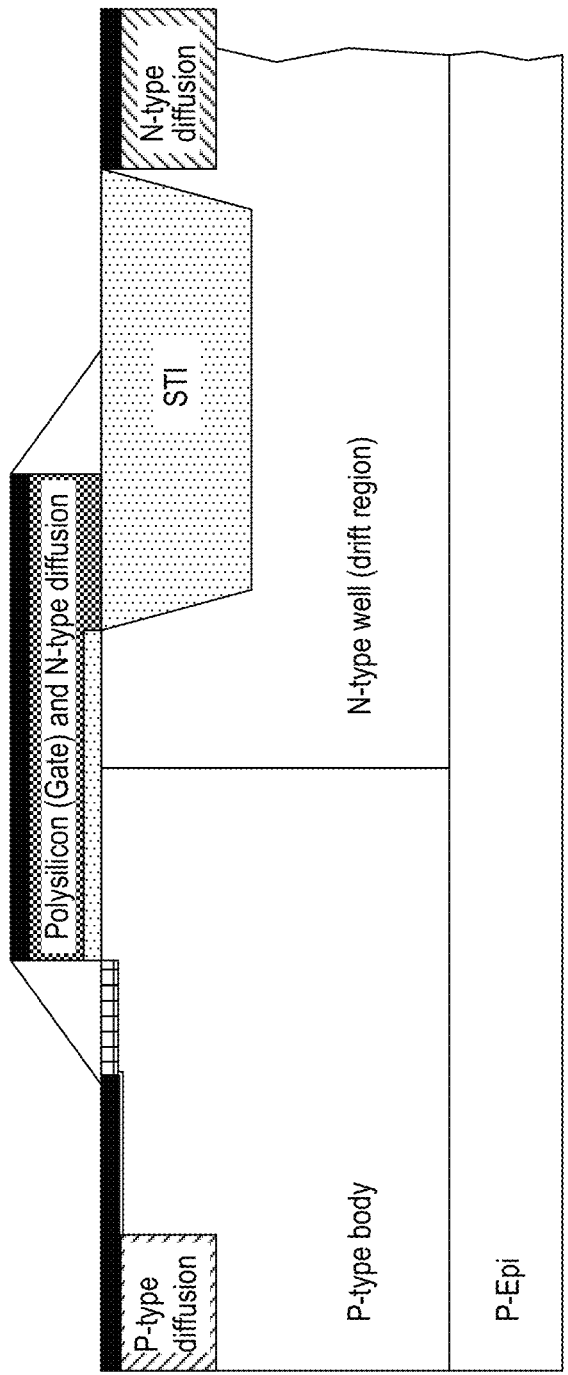

FIGS. 12A-12E are cross-sectional views illustrating various steps in a method of fabricating a hybrid contact LDMOS device in one or more preferred embodiments of the invention, and FIG. 13 is a flowchart illustrating steps of the hybrid contact LDMOS device fabrication process 3000 of FIGS. 12A-12E. More specifically, FIG. 12A is a cross-sectional view illustrating the poly deposition and poly etch to fabricate the gate structure (shown in FIG. 13 at step or process 3100). FIG. 12B is a cross-sectional view illustrating the shallow arsenic implantation (shown in FIG. 13 at step or process 3200). The mask for the shallow arsenic implant was described above with respect to FIG. 3B. FIG. 12C is a cross-sectional view illustrating a step or process 3300 of forming the gate sidewall spacer structure (shown in FIG. 13 at step or process 3300), with such structure covering the first portion of the implant but leaving the second portion exposed. With reference to FIG. 12D, this is followed by the p-type diffusion into the body region to form the body tap (shown in FIG. 13 at step or process 3400) and application of a photoresist coating (mask) to the body region/tap (shown in FIG. 13 at step or process 3500) in preparation for the n-type diffusion into both the gate structure to improve conductivity and the drift region to form a drain region (shown in FIG. 13 at step or process 3600). Finally, FIG. 12E is a cross-sectional view illustrating the formation of the hybrid contact at the source and ohmic contacts at the body tap, the gate structure, and the drain region during the fabrication of the hybrid contact LDMOS. As explained in detail above, the silicidation process preferably involves laying down a blanket layer of metal (shown in FIG. 13 at step or process 3700), which may be via sputtering, and silicidization (shown at step or process 3800). In at least some embodiments, this may involve a first anneal to form a silicide on regions where the metal is in contact with silicon, removing the unreacted metal, and a second anneal which transforms the silicide to a low ohmic phase. These process steps may be used, for example, to fabricate the hybrid contact LDMOS device 100 of FIG. 2.

Variations on the process described with respect to FIGS. 12A-12E may also be utilized without departing from the scope of the present invention. For example, for the embodiment of the hybrid contract shown in FIG. 4A, the process mask for the arsenic implant extends only under the gate sidewall spacer structure, and little or no shallow arsenic is placed outside of the spacer structure. In this embodiment, a pure metal Schottky junction is created with fixed barrier height, which is determined by the selected metal.

The flowchart in FIG. 13 illustrates steps of a hybrid contact LDMOS device fabrication process 3000 in more detail. First, polysilicon is deposited on the gate oxide and etching the polysilicon to form the gate structure at step 3100. Next the body region is implanted with a shallow p-type dopant at step 3200, which is aligned to the gate structure. Then a gate sidewall spacer structure is formed at step 3300, and a p-type dopant is diffused into the body region to form a body tap at step 3400. At step 3500, a photoresist coating is then applied to the body region, including the body tap, but leaving the gate structure and the drift region exposed, and an n-type dopant is diffused into both the gate structure and the drift region at step 3600. The photoresist coating in step 3500 preferably covers all of the body region/tap in the vicinity of the gate structure and extends at least to a point or line coincident with the edge of the gate structure, and may extend slightly over the edge of the gate structure to ensure that the body region/tap are covered, such that the gate structure and drift region are entirely or nearly entirely exposed. A blanket layer of metal is deposited on the surface of the wafer at step 3700. This may be done without any pre-patterning. Finally, silicidation of the metal is performed at step 3800 to form ohmic contacts to the body tap, gate structure, and drain region, along with a hybrid contact as the source region to the channel.

In some embodiments, a corresponding fabrication process has applicability for various other MOS devices, including where the dopant in step 3400 is an n-type dopant.

It should be noted that the description and drawings merely illustrate basic principles of the proposed methods and systems. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the proposed methods and systems and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof. Although specific terms are employed herein, they are used in a generic and descriptive sense only and not for the purpose of limitation.

What is claimed is:

1. A MOSFET transistor structure, comprising:
   (a) a well region of a first dopant polarity;
   (b) a source region on or within the well region;
   (c) a drain region on or within the well region;
   (d) a channel region between the source region and the drain region;
   (e) a gate structure over the channel region;
   (f) a hybrid contact implant, of the second dopant polarity, in the source region or in the drain region; and
   (g) a respective metal contact on or within each of the source region, the gate structure, and the drain region;
   (h) wherein the hybrid contact implant and the metal contact that is on or within the source region or the drain region, respectively, combine to form a hybrid contact that defines first, second, and third electrical junctions, wherein the first electrical junction is a Schottky junction formed vertically between the source metal contact or the drain metal contact, respectively, and the well region, wherein the second electrical junction is an ohmic junction formed laterally between the source metal contact or the drain metal contact, respectively, and the hybrid contact implant, and wherein the third electrical junction is a rectifying PN junction between the hybrid contact implant and the channel region; and
   (i) wherein the hybrid contact implant has an as-implanted depth that defines a first depth, wherein the metal contact of the hybrid contact has a second depth, and wherein the first depth is less than that of the second depth.

2. The transistor structure of claim 1, further comprising a substrate below the well region.

3. The transistor structure of claim 1, wherein:
(a) the hybrid contact implant is a first hybrid contact implant and is in the source region;
(b) the transistor structure further comprises a second hybrid contact implant, of the second dopant polarity, in the drain region;
(c) the second hybrid contact implant and the metal contact that is on or within the drain region combine to form a second hybrid contact that defines fourth, fifth, and sixth electrical junctions, wherein the fourth electrical junction is a Schottky junction formed vertically between the drain metal contact and the well region, wherein the fifth electrical junction is an ohmic junction formed laterally between the drain metal contact and the second hybrid contact implant, and wherein the sixth electrical junction is a rectifying PN junction between the second hybrid contact implant and the channel region; and
(d) the second hybrid contact implant has an as-implanted depth that defines a third depth, wherein the metal contact of the second hybrid contact has a fourth depth, and wherein the third depth is less than that of the fourth depth.

4. The transistor structure of claim 1, wherein the hybrid contact implant is aligned to the gate structure.

5. The transistor structure of claim 1, wherein the hybrid contact implant has a doping concentration that is greater than 1e19 atoms per cubic centimeter.

6. The transistor structure of claim 1, wherein an interfacial dopant layer is provided between the metal contact and the well region thereby modulating a barrier height and turn-on voltage of the first electrical junction.

7. The transistor structure of claim 1, wherein the first electrical junction has a turn-on voltage that is in the range 0.1V to 0.5V.

8. The transistor structure of claim 1, wherein a parasitic bipolar junction transistor is formed from the drain-well-source regions, and wherein the parasitic bipolar junction transistor formed from the drain-well-source regions has a bipolar gain of less than 1.

9. The transistor structure of claim 1, wherein the gate structure has a source region side and a drain region side, wherein a gate sidewall spacer structure is disposed along the gate structure on the source region and the drain region side thereof, and wherein the hybrid contact implant is disposed directly beneath the gate sidewall spacer structure on the source region side or the drain region side, respectively, thereof.

10. The transistor structure of claim 9, wherein the metal contact that is on or within the source region and the drain region is aligned to the gate sidewall spacer structure.

11. The transistor structure of claim 9, wherein a first portion of the hybrid contact implant is disposed beneath the gate sidewall spacer structure and a second portion of the hybrid contact implant is exposed adjacent to the gate sidewall spacer structure, wherein the second electrical junction is formed laterally between the source metal contact or the drain metal contact, respectively, and the first portion of the hybrid contact implant, and wherein the third electrical junction is a rectifying PN junction between the first portion of the hybrid contact implant and the channel region.

12. The transistor structure of claim 1, wherein each of the respective metal contacts on or within each of the source region, gate structure, and drain region is a silicide.

13. A MOSFET transistor structure, comprising:
(a) a well region of a first dopant polarity;
(b) a source region on or within the well region;
(c) a drain region on or within the well region;
(d) a channel region between the source region and the drain region;
(e) a gate structure over the channel region, wherein the gate structure has a source region side and a drain region side, wherein a gate sidewall spacer structure is disposed along the gate structure on the source region and the drain region side thereof;
(f) a hybrid contact implant, of the second dopant polarity, in the source region or in the drain region; and
(g) a respective metal contact on or within each of the source region, the gate structure, and the drain region;
(h) wherein a first portion of the hybrid contact implant is disposed beneath the gate sidewall spacer structure and a second portion of the hybrid contact implant is exposed adjacent to the gate sidewall spacer structure;
(i) wherein the hybrid contact implant and the metal contact that is on or within the source region or the drain region, respectively, combine to form a hybrid contact that defines first, second, and third electrical junctions, wherein the first electrical junction is a Schottky junction formed vertically between the source metal contact or the drain metal contact, respectively, and the well region, wherein the second electrical junction is an ohmic junction formed laterally between the source metal contact or the drain metal contact, respectively, and the first portion of the hybrid contact implant, and wherein the third electrical junction is a rectifying PN junction between the first portion of the hybrid contact implant and the channel region.

14. The transistor structure of claim 13, further comprising a substrate below the well region.

15. The transistor structure of claim 13, wherein:
(a) the hybrid contact implant is a first hybrid contact implant and is in the source region;
(b) the transistor structure further comprises a second hybrid contact implant, of the second dopant polarity, in the drain region;
(c) a first portion of the second hybrid contact implant is disposed beneath the gate sidewall spacer structure and a second portion of the second hybrid contact implant is exposed adjacent to the gate sidewall spacer structure; and
(d) the second hybrid contact implant and the metal contact that is on or within the drain region combine to form a second hybrid contact that defines fourth, fifth, and sixth electrical junctions, wherein the fourth electrical junction is a Schottky junction formed vertically between the drain metal contact and the well region, wherein the fifth electrical junction is an ohmic junction formed laterally between the drain metal contact and the first portion of the second hybrid contact implant, and wherein the sixth electrical junction is a rectifying PN junction between the first portion of the second hybrid contact implant and the channel region.

16. The transistor structure of claim 13, wherein the hybrid contact implant is aligned to the gate structure.

17. The transistor structure of claim 13, wherein the hybrid contact implant has an as-implanted depth that defines a first depth, wherein the metal contact of the hybrid contact has a second depth, and wherein the first depth is less than that of the second depth.

18. The transistor structure of claim 13, wherein the hybrid contact implant has a doping concentration that is greater than 1e19 atoms per cubic centimeter.

19. The transistor structure of claim 13, wherein an interfacial dopant layer is provided between the metal contact and the well region thereby modulating a barrier height and turn-on voltage of the first electrical junction.

20. The transistor structure of claim 13, wherein the first electrical junction has a turn-on voltage that is in the range 0.1V to 0.5V.

21. The transistor structure of claim 13, wherein a parasitic bipolar junction transistor is formed from the drain-well-source regions, and wherein the parasitic bipolar junction transistor formed from the drain-well-source regions has a bipolar gain of less than 1.

22. The transistor structure of claim 13, wherein the metal contact that is on or within the source region and the drain region is aligned to the gate sidewall spacer structure.

23. The transistor structure of claim 13, wherein each of the respective metal contacts on or within each of the source region, gate structure, and drain region is a silicide.

\* \* \* \* \*